(12) United States Patent
Casablanca et al.

(10) Patent No.: US 12,099,022 B2
(45) Date of Patent: Sep. 24, 2024

(54) DEVICES AND METHODS FOR HIGH ANGLE LIQUID ELECTRON TOMOGRAPHY

(71) Applicants: Universidad Rey Juan Carlos, Mostoles (ES); NANOMEGAS SPRL, Brussels (BE)

(72) Inventors: Jesus Gonzalez Casablanca, Mostoles (ES); Stavros Nicolopoulos, Brussels (BE)

(73) Assignees: Universidad Rey Juan Carlos, Mostoles (ES); NANOMEGAS SPRL, Brussels (BE)

( * ) Notice: Subject to any disclaimer, the term of this patent is extended or adjusted under 35 U.S.C. 154(b) by 320 days.

(21) Appl. No.: 17/783,869

(22) PCT Filed: Dec. 18, 2020

(86) PCT No.: PCT/EP2020/087220
§ 371 (c)(1),
(2) Date: Jun. 9, 2022

(87) PCT Pub. No.: WO2021/123305
PCT Pub. Date: Jun. 24, 2021

(65) Prior Publication Data
US 2023/0010573 A1    Jan. 12, 2023

(30) Foreign Application Priority Data
Dec. 18, 2019   (EP) ..................................... 19217449

(51) Int. Cl.
G01N 23/04        (2018.01)
G01N 23/046       (2018.01)

(52) U.S. Cl.
CPC ..... G01N 23/046 (2013.01); G01N 2223/418 (2013.01)

(58) Field of Classification Search
CPC ....................... G01N 23/046; G01N 2223/418
USPC .......................... 250/306, 307, 309, 310, 311
See application file for complete search history.

(56) References Cited

U.S. PATENT DOCUMENTS

| | | | |
|---|---|---|---|
| 7,807,979 B2 | 10/2010 | Liu et al. | |
| 8,852,408 B2 | 10/2014 | Chey et al. | |
| 9,412,556 B2 | 8/2016 | Khalid et al. | |
| 9,666,409 B2 | 5/2017 | Damiano, Jr. et al. | |
| 2012/0120226 A1 | 5/2012 | de Jonge | |
| 2015/0194288 A1 | 7/2015 | Hsieh et al. | |
| 2016/0042912 A1 | 2/2016 | Adiga et al. | |
| 2016/0313306 A1* | 10/2016 | Ingber | C12M 35/04 |
| 2021/0072170 A1* | 3/2021 | Hendriksen | H01J 37/20 |
| 2021/0249219 A1* | 8/2021 | Woehl | H01J 37/20 |

FOREIGN PATENT DOCUMENTS

WO    2015134575 A1    9/2015

OTHER PUBLICATIONS

Int'l Search Report for PCT/EP2020/087220, dated Mar. 29, 2021.
(Continued)

*Primary Examiner* — Nicole M Ippolito
(74) *Attorney, Agent, or Firm* — MaxGoLaw PLLC

(57) ABSTRACT

Devices and methods are described for performing high angle tilting tomography on samples in a liquid medium using transmission electron beam instruments.

20 Claims, 10 Drawing Sheets

(56) References Cited

OTHER PUBLICATIONS

De Jonge, et al., "Practical Aspects of Transmission Electron Microscopy in Liquid", Chapter 1, Advances in Imaging and Electron Physics, vol. 186, Springer 2014, pp. 1-37.
G. Marchello et al., "4D Liquid Phase Electron Microscopy of Ferritin by Brownian Single Particle Analysis", Cornell Univ. Lib. (Jul. 7, 2019).
Hoppe et al., "In Situ Transmission Electron Microscopy of Liposomes in an Aqueous Environment", Langmuir, vol. 29, No. 32, pp. 9958-9961, Jul. 2013.
M. Kudryashev, Chapt. 10, "Resolution in Electron Tomography", Sec. 3, Resolution of Tomographic Reconstructions, pp. 261-282, in Cellular Imaging: Electron Tomography and Related Techniques, E Hansen ed. (Springer 2018); Maiorca, et al., Chapt. 11, "Signal Optimization in Electron Tomography," pp. 283-295.
Penczek and Frank, Ch. 10, "Resolution in Electron Tomography", Sec. 4, Influence of Missing Fourier Information on Resolution in Tomographic Reconstructions, pp. 319-326, in Electron Tomography Methods for Three-Dimensional Visualisation of Structures in the Cell, J. Frank ed. (Springer 2005 2d Ed.).
R.K. Leary and P.A. Midgley, Ch. 26, Electron Tomography in Material Science, pp. 1279-1329, in Springer Handbook of Microscopy (Springer 2019).
Dearnaley, et al., "Liquid Cell Electron Tomography for Biomedical Applications", Microsc. Microanal. 24 (Suppl 1), 2018, pp. 268-269.
Karakulina et al., "In Situ Electron Diffraction Tomography Using a Liquid-Electrochemical Transmission Electron Microscopy Cell for Crystal Structure Determination of Cathode Materials for Li-Ion batteries", Nano Lett. vol. 18, No. 10, pp. 6286-6291 (2018).
Wennemacher, et al., "3D-structured supports create complete data sets for electron crystallography", Nature Comm., v. 10, Article No. 3316 (2019).
Tai et al, "Quantitative Characterization of Nanoparticles in Blood by Transmission Electron Microscopy with a Window-type Microchip Nanopipet", Anal. Chem., vol. 84, pp. 6312 to 6316.
Pu et al., "Liquid cell transmission electron microscopy and its applications", R. Soc. open sci. 7: 191204, Liquid TEM review, Nov. 2019.
K-Kit Brochure 2018.
Poseidon Select Brochure.
DENS Ocean Liquid Brochure - AXT.
Ring, et al., "Silicon Nitride Windows for Electron Microscopy of Whole Cells", J. Microsc. Sep. 2011; 243(3), pp. 273-283.
Kimura, "Observation of Solution Samples by Transmission Electron Microscope", Sci. Inst. News, vol. 11, Sep. 2018.
De Jonge, et al., "Electron microscopy of specimens in liquid", Nature Nanotechnology, vol. 6, Nov. 2011, pp. 695.704.
Rasool, et al., "Graphene-sealed Si/SiN cavities for high-resolution in situ electron microscopy of nano-confined solutions", Physica Status Solidi B., 1-4 (2016).
Jensen, et al., "Monolithic Chip System with a Microfluidic Channel for In Situ Electron Microscopy of Liquids", Microsc. Microanal., 20, 445-451 (2014).
Textor, et al., "Strategies for Preparing Graphene Liquid Cells for Transmission Electron Microscopy", Nano Letts. 18, 6, 3313-3321 (2018).
PELLCO Liquid Cell application, downloaded from https://www.tedpella.com/grids_html/silicon-aperture.aspx.
A. Hutzler, Development of advanced liquid cell architectures for high performance in situ transmission electron microscopy in materials sciences. Ph.D., Friedrich-Alexander University, Erlangen-Nurnberg (2018) (Chapters 3 and 4 only (4 Attachments Due To Size)).
Nielsen, et al., "In situ TEM imaging of CaCO3 nucleation reveals coexistence of direct and indirect pathways—supplemental materials", Science, vol. 345, No. 6201, Sep. 5, 2014.
Mueller, et al., "Nanofluidic Cells with Controlled Pathlength and Liquid Flow for Rapid, High-Resolution In Situ Imaging with Electrons", Journal of Physical Chemistry Letters, vol. 4, No. 14, Jul. 1, 2013., pp. 2339-2347.
Dukes, et al., "Development of Reinforced Silicon Nitride Membranes for in situ Liquid Electron Microscopy", Microscopy and Microanalysis, vol. 19, No. S2, Aug. 1, 2013, pp. 406-407.

\* cited by examiner

DEVICES AND METHODS FOR HIGH ANGLE LIQUID ELECTRON TOMOGRAPHY

FIELD OF THE INVENTION

The invention, in general, relates to investigation of samples in a liquid medium using transmission electron beam instruments and, in particular, to devices and methods for obtaining tomographic data from such samples in such instruments.

BACKGROUND OF THE INVENTION

In transmission electron beam tomography, essentially two-dimensional data is acquired and reconstructed mathematically to reveal the three-dimensional internal structure and composition of a sample.

In particular, in so called "tilting tomography", a sequence of essentially two-dimensional data sets are acquired from a sample in a transmission electron beam instrument at a series of sample tilts and a mathematical model is reconstructed to reveal the three-dimensional internal structure of the sample In tilting tomography, the resolution of the reconstructed mathematical model parallel to the tilt axis is limited only by the resolution of the two-dimensional data sets, while the resolution perpendicular to the tilt axis—that is, along the optical axis of the electron beam instrument—is limited, mainly by the size of the sample tilt interval between data acquisition and the total sample tilt range over which data is acquired. In particular, it has been recognized that reliable tilting tomography requires a total tilting rage of at least 120 degrees. See, e.g., M. Kudryashev, Ch. 10 Sec. 3 *Resolution of Tomographic Reconstructions in Cellular Imaging: Electron Tomography and Related Techniques* (Springer 2018); P. A: Penczek and J. Frank, Ch. 9 Sec. 4, *Influence of Missing Fourier Information on Resolution in Tomographic Reconstructions in Electron Tomography Methods for Three-Dimensional Visualisation of Structures in the Cell* (Springer, 2005 2d Ed.).

Different types of data may be used for tomographic reconstruction, acquired according to the specific type of transmission electron beam instrument/mode of operation employed—e.g., transmission electron microscope ("TEM") or scanning transmission electron microscope ("STEM") operating in imaging or diffraction mode, or dedicated electron diffractometer ("ED")—and the specific type of data and mode of data acquisition—e.g., x-ray spectroscopic data using an energy-dispersive x-ray ("EDX") detector, energy loss data using an electron energy loss spectrometer ("EELS"), diffraction or imaging data using different electron detector configurations or holographic data using and electron bi-prism or other holographic capabilities. Transmission electron beam tomography, including tilting tomography, conducted in a suitably equipped and operated instrument can thus reveal information about internal three-dimensional microscopic and atomic-level structure, including chemical composition, chemical bonding states, electric and magnetic fields, etc. See, e.g., R. K. Leary and P. A. Midgley, Chapter 26, Electron Tomography in Material Science, pages 1279 to 1329, in Springer Handbook of Microscopy (Springer 2019).

The high vacuum environment of conventional transmission electron beam instruments allows investigation of only solid and vacuum stable samples. As a consequence, much investigation, including tomographic investigation, of samples naturally found in a liquid medium, particularly biological samples, in transmission electron beam instruments has required often complex and time-consuming sample preparation processes, such as dehydration, fixing and staining, which are susceptible to the introduction of sample preparation artefacts.

Devices have been developed to facilitate dehydration of liquid samples containing nano-particulates. Using such devices, nano-particulates in a liquid medium, e.g., blood cells in a blood solution, are introduced, by capillary action, between a pair of electron transparent membranes, the liquid medium removed by evaporation, to leave the nano-particulates, e.g., blood cells, supported by an electron transparent membrane, and the device loaded into a conventional electron beam instrument. See, e.g., US Pub. App. No. 20150194288 A1 (National Health Research Institutes and Materials Analysis Technology (US) Corp.)

Other investigations of samples naturally found in a liquid medium have relied on so-called cryo-microscopy, in which the sample is rapidly cooled and maintained in a solid phase, at close to liquid nitrogen temperature, during data acquisition. Cryo-microscopy requires specially adapted equipment and is necessarily complicated and expensive to implement.

Some investigations of biological, and non-biological, samples in a liquid medium have been conducted with so-called liquid cell devices, in which the sample is maintained in the liquid medium during data acquisition in the transmission electron beam instrument. "Open" liquid cell devices allow for the circulation of liquids during data acquisition, see, e.g., US Pub. Pat. App. No. 20120120226 A1 (Vanderbilt University), and, optionally, for the conduction of electrochemical processes during data acquisition. Though open liquid cell devices can be used with conventional transmission electron beam instrument they do require specially adapted sample holders (also referred to herein as specimen holders). "Closed" liquid cell devices, on the other hand, can be filled with a liquid medium containing the sample of interest, sealed, and introduced into a conventional transmission electron beam instrument using a standard sample holder. See, e.g., U.S. Pat. No. 7,807,979 (National Tsing Hua University 2010).

Despite the widespread and longstanding use of electron beam tomography in transmission instruments, and the increasingly widespread use of liquid cell devices in transmission electron beam instruments, transmission electron beam tomography, including tilting tomography, of samples in a liquid medium has been done rarely and with only limited success.

For example, Marchello et al., 4D Liquid Phase Electron Microscopy of Ferritin by Brownian Single Particle Analysis, Cornell University Library (7 Jul. 2019), describe a technique in which a single particle undergoing translational and rotational Brownian motion in a liquid medium is imaged sequentially, without tilting of the liquid cell device. The resulting TEM images, obtained at different orientations of the particle, are combined mathematically to create a 3D representation of the structure of the particle. See, e.g., FIG. 1. Dearnaley et al., Nano Lett. vol. 19 no. 10, pages 6734-6741 (2019) describe acquisition of TEM images of a sample in liquid medium in a closed liquid cell device titled over a total angular range of only 90° (or ±45°), the liquid cell device being specially-constructed from a silicon chip containing a silicon nitride ("SiN") membrane locked in place over a Cu-grid coated with a plastic film and supporting a biological sample in a liquid medium. Using this arrangement, images were obtained from a bacteriophage attached to a host bacterium and tomographic reconstruction used to reveal its internal three-dimensional structure, see page 6735, RH column to page 6736, LH column, albeit with inherently limited axial resolution.

Karakulina et al., Nano Lett. vol. 18, no. 10, pages 6286-6291 (2018) describe acquisition of TEM diffraction data over a total available 60° tilt range from $LiFePO_4$ particles immersed in an organic-electrolyte in a commercial open liquid cell device equipped with electrodes and a pair of electron-transparent SiN membranes. However, degradation of the acquired diffraction data resulting from movement of the $LiFePO_4$ particles during data acquisition, probably due to Brownian motion and displacement of the organic electrolyte, reduced the effective liquid cell device/sample total tilt range to only 35°. See page 6287, RH column to page 6288, LH column. Any image data acquired using the liquid cell device of Karakulina et al. would be insufficient for reliable tomographic reconstruction because of the total available tilt range of only 60° (or ±30°).

Bio Ma-Tek Corporation of Taiwan offers closed liquid cell devices, referred to herein using the trade name "K-Kit", with a silicon body supporting a pair of parallel electron-transparent SiN membranes separated by a fixed gap of from 100 to 5,000 nm, between which a liquid medium can be introduced by capillary action, similar to the K-Kit described above for dehydration and examination of blood samples in US Pub. App. No. 20150194288 A1, and similar to the liquid cell devices also described above for observation of samples in a liquid medium in U.S. Pat. No. 7,807, 979. See, e.g., http://www.bioma-tek.com/bioma-tek/en/technology.php?act=view&no=30. However, the K-Kit is inherently limited to a total sample tilt range of only around 80° (or ±40°), reducing the reliability of any three-dimensional mathematical reconstruction based on imaging data acquired from a K-Kit liquid cell device.

US Pub. Pat. App. No. 20120120226 A1 describes another open liquid cell device that offers a total sample tilt range of only around 70° (or ±35°), which the applicants themselves acknowledge would yield tomographic data with unacceptably low axial resolution. (see para. [00176]) US Pub. Pat. App. No. 20120120226 A1 instead proposes high speed data acquisition, involving rapid sample tilting, as a means for acquiring tomographic tilting data from living samples in a liquid medium. (See id). No reported custom built or commercial closed or open liquid cell devices allow for data acquisition during sample tilting through high angular ranges, up to and beyond 120° (or ±60°).

It would be advantageous to develop devices and methods for obtaining reliable high angle tilting tomographic data, over total angular tilting ranges greater than 120°, from samples in a liquid medium in transmission electron beam instruments.

OBJECT OF THE INVENTION

It is an object of the present invention to provide devices and methods for preparing a sample in a liquid medium for acquisition of high angle tomographic data in a transmission electron beam instrument.

It is an object of the present invention to provide devices and methods for acquiring high angle, over total tilt range of beyond 120 degrees, tomographic data from a sample in a liquid medium in a transmission electron beam instrument.

It is a further object of the invention to provide an alternative to the prior art.

SUMMARY OF THE INVENTION

Thus, the above-described objects and several other objects are intended to be obtained in a first aspect of the invention by providing a liquid cell device for acquiring high angular range tomographic data from a sample in a liquid medium in a transmission electron beam instrument, the liquid cell device comprising a main body comprising opposing first and second main body surfaces and an aperture affording a line of sight between the first and second main body surfaces, and a liquid accessible volume enclosed by the main body and at least partially contained within the aperture. The liquid accessible volume containing an intersection of the line of sight with a substantially perpendicular rotational axis of the liquid cell device, with substantially parallel first and second electron transparent membranes disposed substantially equidistant from the rotational axis, each membrane spanning the aperture and having an exterior surface forming a part of an external surface of the liquid cell device and an opposing interior surface abutting the liquid accessible volume.

The device in the first aspect of the invention further characterized in that the first and second membranes, main body first and second surfaces and aperture are configured such that, during rotation of the liquid cell device around the rotational axis through an angular range of at least 120 degrees, the line of sight through a portion of the liquid accessible volume is maintained over a projected viewable area of at least 10 square micrometers and the viewable area is at a maximum substantially at the angular range mid-point and at minima at the angular range end-points.

A liquid cell device means a cell, open or closed, in which a sample in a liquid medium can be isolated from the vacuum environment while data is acquired from the sample in a transmission electron beam instrument.

A sample in a liquid medium includes a sample or samples immersed in a liquid medium and a sample or samples forming a suspension in a liquid medium.

A high angular range means an angular range of at least 120 degrees.

An electron beam instrument means any instrument in which an electron beam can be directed at a sample and as a result of which interaction data is obtained, including a TEM, STEM, electron diffractometer, etc. A STEM includes a TEM operating in STEM mode. Such instruments typically operate at above 60 kV, typically 100 to 300 kV, and possibly as high as around 1 MV.

Tomographic data means any data that can be acquired in a transmission electron beam instrument at different sample rotations, also referred to herein as sample tilts, across an angular range for use in tomographic reconstruction to reveal internal structure of a sample.

High angular range, or high angle, tomographic data means tomographic data acquired over an angular range of at least 120 degrees.

Data means any type of data that can be acquired from a sample in a transmission electron beam instrument, including data acquired in parallel, such as diffraction data or imaging data, whether bright field or dark field, or acquired sequentially, as an electron probe is scanned across the sample, whether acquired using an energy-dispersive x-ray detector, an electron energy loss spectrometer, a bright field or dark field detector, etc. Data can also include holographic data acquired with the aid of an electron bi-prism or other device suitable for electron holography.

A sample means any object or objects suitable for investigation in a transmission electron beam instrument, biological, including bacteria, cells, viruses, organic or inorganic, crystalline or non-crystalline. A sample can comprises a multiplicity of solid or semi-solid particles immersed or suspended in the liquid medium, including particles of any shape, such as filaments. A sample can also comprise nanometer-scale objects or an object or objects of any scale up to a size that can be introduced into and accommodated in a liquid medium in the liquid cell device.

A liquid medium means any suitable organic or inorganic liquid in which a sample can be held or suspended.

A main body means the body of the liquid cell device enclosing the membranes which isolate the liquid medium from the instrument vacuum. A main body need not necessarily be formed in a single piece and may be separable into two different portions, allowing introduction of a liquid medium between the electron transparent membranes when the portions are separated.

Opposing first and second main body surfaces means surfaces on opposite sides of the main body.

An aperture affording a line of sight between the first and second main body surfaces means an aperture through which at least a fraction of the area of a notional parallel beam of radiation propagating in a straight line impinging on the first main body surface, such as a notional beam of visible light, would pass through the aperture and exit from the second main body surface, assuming no reflection of radiation by the aperture walls and discounting any possible absorption/refraction of the radiation by the membranes or a liquid medium/sample between the membranes.

A liquid accessible volume means a physical space or region into which a liquid medium containing a sample can be introduced. A liquid accessible volume may be sealable, such that it may be isolated from the space outside the liquid cell device, or may allow for a liquid medium located outside the liquid cell device to be circulated through the liquid accessible volume during acquisition of high angular range tomographic data. The volume can be liquid-accessible by capillary action through a channel or channels leading an opening or openings in the outside surface of the main body or other means, such as temporary separation of the main body into two or more parts.

A liquid accessible volume enclosed by the main body means a liquid accessible volume surrounded and supported by, but not completely enclosed by, the main body, in that at least a portion of the liquid accessible volume is bounded by freestanding, also referred to herein as electron transparent, first and second membranes and the liquid accessible volume may be connected to the outside of the main body by a channel or channels leading to an opening or openings in the outside surface of the main body.

At least partially contained within the aperture means that the liquid accessible volume can extend beyond the aperture into the main body, through one or more channels, as far as one or more openings in the main body surface.

Containing an intersection of the line of sight and a substantially perpendicular rotational axis means that such an intersection lies within the volume.

A rotational axis means an axis around which the liquid cell device may be rotated, also referred to herein as tilted, for example, once mounted in a specimen holder and loaded in a transmission electron beam instrument. The rotational axis need not necessarily intersect a center of mass of the liquid cell device.

Electron transparent membrane means sufficiently permeable to electrons accelerated to the voltage ranges typically used in a transmission electron beam instrument, 60 kV up to 300 kV, or up to 1 MV in some instruments, to allow collection of usable high angle tomographic data. What constitutes sufficiently electron transparent will vary not only as a function of instrument operating voltage/incident electron energy, but also with the instrument configuration, type of data acquired and the requirements of a particular investigation of a particular liquid medium and sample. The degree of electron transparency of a particular membrane will depend on the material from which it is constituted and its thickness. For example, an electron transparent membrane suitable for many tomographic applications can be composed of SiN and have a thickness of around 30 nm, or from 10 to 50 nm.

A membrane having an exterior surface and an opposing interior surface means a membrane comprising at least a freestanding, or electron transparent, part supported at its edges.

At least substantially planar means at least substantially planar at least when the pressure is equalized on the interior and exterior electron transparent membrane surfaces.

The freestanding, or electron transparent, part of the membrane may be bordered by regions of membrane material having exterior or interior surfaces abutting or fixed to the aperture walls or a main body surface or extending into the main body itself, and not necessarily at least substantially planar where abutting or fixed to the aperture walls or a main body surface or extending into the main body, while the freestanding, or electron transparent, part of the membrane, that part of the membrane which has an exterior surface that forms part of the exterior surface of the liquid cell device and an opposing interior surface that abuts the liquid accessible volume, remains at least substantially planar.

Spanning and having an exterior surface forming a part of an external surface of the liquid cell device and an opposing interior surface abutting the liquid accessible volume means each electron transparent membrane spanning the entire aperture width so as to prevent passage of liquid through the aperture, such that the first and second electron transparent membranes together isolate the liquid accessible volume from the vacuum environment of the transmission electron beam instrument, once the cell is sealed, as needed, and loaded into such instrument.

Configured means sized, shaped and disposed relative to each other.

A projected viewable area means the area parallel projected, i.e., without magnification, along a line of sight through the at least a portion of the liquid accessible volume. The projection being that formed by a notional parallel beam of radiation propagating in a straight line, as described above, and not the area actually projected in a transmission electron beam instrument, which may be greatly magnified.

The projected viewable area being maintained over a projected viewable area of at least 10 square micrometers means that the projected viewable are stays above 10 square micrometers while the liquid cell is rotated about the rotational axis through the angular range of at least 120 degrees.

An advantage of providing a liquid cell device capable of maintaining a projected viewable area over at least 10 square micrometers while the liquid cell device is rotated about the rotational axis through an angular range of at least 120 degrees is that such a device is capable of acquiring high angular range tomographic data over a representative and/or statistically significant area of a sample in a liquid medium, bearing in mind the typical size of samples that can be introduced in a liquid medium into the liquid accessible volume.

The projected viewable area being at a maximum substantially at the angular range midpoint means that the midpoint of the angular range is close to the orientation at which the length of the line of sight intersecting the liquid accessible volume is at a minimum. When first and second electron transparent membranes are parallel, the maximum projected viewable area corresponds to the line of sight being along the surface normal of the first and second membranes. The viewable area minima at the end points of the angular range can be equal, if the angular range is symmetrically disposed about the surface normal of the first and second membranes.

Advantages of providing a liquid cell device for acquiring tomographic data over a high angular range include suitability of the liquid cell device for obtaining more reliable structural determination by diffraction of lower symmetry structures, such a monoclinic or other low-symmetry crystalline phases, as a consequence of sampling over an increased fraction of reciprocal space, and, in general, improved accuracy and reliability of three-dimensional mathematical reconstruction based on such high angular range data, such that the mathematical reconstruction more closely corresponds to actual internal sample structure. Mathematical reconstructions based on high angular range data obtained from such a liquid cell device enable projection artefacts to be more effectively overcome.

In another aspect of the invention, the angular range is at least 140 degrees.

An advantage of providing a liquid cell device suitable for acquiring tomographic data over an angular range of at least 140 degrees is improved ability to resolve the internal structure of samples by tomographic reconstruction.

In another aspect of the invention, the maintained projected viewable area is at least 100 square micrometers.

An advantage of providing a liquid cell device capable of maintaining a projected viewable area over at least 100 square micrometers while the liquid cell device is rotated about the rotational axis through an angular range of at least 120 degrees, or at least 140 degrees, is that it is suitable for acquiring high angular range tomographic data over a more representative and/or statistically significant area of a sample in a liquid medium, bearing in mind the typical size of samples that can be introduced in a liquid medium into the liquid accessible volume.

In another aspect of the invention, the first and second electron transparent membranes are at least substantially parallel to each other, have at least substantially similar shape and size, and are at least substantially overlapping when viewed along their common surface normal, such that they are separated from each other by a gap measured along their common surface normal.

At least substantially parallel to each other means close to parallel or parallel.

At least substantially similar shape and size means electron transparent membranes that have close to or the same shape and size.

Electron transparent membranes that are at least substantially overlapping when viewed along their common surface normal, such that they are separated from each other by a gap measured along their common surface normal, means electron transparent membranes aligned such that their internal surfaces are separated by a uniform distance, the gap, and only an unsubstantial fraction of each electron transparent membrane internal surface does not face part of the internal surface of the other membrane.

In another aspect of the invention, the first and second electron transparent membranes have a width, measured along a direction perpendicular to their intersection with a plane perpendicular to the liquid cell device rotation axis and a length, measured along a direction parallel to their intersection with a plane perpendicular to the liquid cell device rotation axis, wherein the width is less than the length.

An electron transparent membrane having a width and a length means an electron transparent membrane having an at least substantially rectangular shape, including a rectangular electron transparent membrane or an electron transparent membrane that is substantially confined within a rectangle, such as an electron transparent membrane having one or more rounded corners or one or more inwardly or outwardly bowed sides.

An advantage of having the length of the first and second electron transparent membranes measured along a direction parallel to their intersection with a plane perpendicular to the liquid cell device rotation axis be greater than their width is that, for a given electron transparent membrane area, the liquid cell device may be tilted to higher angles about its rotational axis and still maintain a sufficiently large projected viewable area.

Another advantage of having the length of the first and second electron transparent membranes measured along a direction parallel to their intersection with a plane perpendicular to the liquid cell device rotation axis be greater than their width is that, for a given electron transparent membrane area, the corresponding decrease in electron transparent membrane width may be sufficient to reduce excessive outward bulging of the electron transparent membranes caused by a pressure difference between the liquid medium containing the sample and the vacuum environment of the transmission electron beam instrument, presenting a close to uniform thickness liquid medium containing the sample.

Advantages of a liquid cell device presenting a close to uniform thickness liquid medium containing the sample include improved capacity to acquire usable high angular range tomographic data and the ability to reliably select a gap between first and second membranes.

In another aspect of the invention, the first and second electron transparent membranes having a width, measured along a direction perpendicular to their intersection with a plane perpendicular to the liquid cell device rotation axis, of no more than 90 micrometers, and a length, measured along a direction parallel to their intersection with a plane perpendicular to the liquid cell device rotation axis, of at least 350 micrometers.

An advantage of a liquid cell device having such first and second electron transparent membranes shaped to have a width of no more than 90 micrometers and a length of at least 350 micrometers, is that the electron transparent membranes are sufficiently narrow to prevent excessive bulging during data acquisition and yet sufficiently long to allow tilting over a high angular range.

In another aspect of the invention, the first and second electron transparent membranes, aperture and liquid accessible volume further comprise opposing extension portions extending along a direction perpendicular to the length of the first and second membranes.

An advantage of a liquid cell device having such perpendicular electron transparent membrane extension portions, which can extend to form intersecting orthogonal electron transparent membranes of the same length as the intersected membranes, is that such a liquid cell device is suitable for acquiring tomographic data along orthogonal rotation axis from the same portion of sample in a liquid medium located at the area of intersection of the electron transparent membranes and the orthogonal extension portions.

In another aspect of the invention, the liquid cell device further comprises a removable filling portion extending from the main body and comprising at least one opening liquidly connected the liquid accessible volume.

An advantage of the removable filling portions is that the liquid cell device can be filled without risking accidentally applying an undesirable covering to the exterior surfaces of the electron transparent membranes with liquid medium containing the sample The above-described objects and several other objects are further intended to be obtained in another aspect of the invention by providing a method for preparing a sample in a liquid medium for acquisition of high angle tomographic data in a transmission electron beam instrument, the method comprising introducing a sample in a liquid medium into the liquid accessible volume of the liquid cell device as described above.

Advantages of introducing a liquid medium containing a sample into the liquid cell device as described above include the ability to select an electron transparent membrane gap that ensures substantially sample immobility and, in the case of crystalline samples, ensuring a substantially random orientation distribution. Substantial immobility facilitates all types data used for high angular range electron tomography, while a substantially random orientation facilitates diffraction analysis of structures with low symmetry.

Another aspect of the method further comprising introducing the liquid cell device into the transmission electron beam instrument, exposing the sample in the liquid accessible volume to an incident electron beam generated in the transmission electron beam instrument, and acquiring data from the sample while rotating the liquid cell device about its rotational axis through an angular range of at least 120 degrees.

Advantages of acquiring tomographic data over a high angular range include more reliable structural determination by diffraction of lower symmetry structures, such a monoclinic or other low-symmetry crystalline phases, as a consequence of sampling over an increased fraction of reciprocal space, and, in general, improved accuracy and reliability of three-dimensional mathematical reconstruction based on such high angular range data, such that the mathematical reconstruction more closely corresponds to actual internal sample structure. Mathematical reconstructions based on high angular range data more effectively overcome projection artefacts.

In other aspects, the data acquired can be X-ray EDS data or can be acquired from electrons transmitted through the sample and comprise diffraction, imaging or EELS data or any other signal derived from the beam-sample interaction, susceptible of being used in tomographic reconstruction.

Specifically, data collected from electron transmitted through the sample can include data acquired using a bright-field ("BF") detector, an annular dark field ("ADF") detector, or an HAADF ("High Angle Annular Dark Field") detector, including a suitably disposed two-dimensional detector configured to function as a BF, ADF or HAADF detector, by integrating the signal from an area of the two-dimensional detector corresponding to the range of scattering angles collected by a BF, ADF, or HAADF detector, respectively. Data may be acquired from electrons transmitted through the sample in conjunction with the use of, for example, an energy filter or an electron bi-prism.

In another aspect of the method, tomographic reconstruction is applied to the data to reveal the three-dimensional internal structure of at least a portion of the sample.

Another aspect of the invention further comprises selecting a liquid cell device having a gap between substantially parallel first and second electron transparent membranes that ensures that a substantial fraction of the sample remains sufficiently immobile during the data acquisition to allow reliable tomographic reconstruction.

What constitutes a substantial fraction remaining sufficiently immobile to allow reliable tomographic reconstruction will depend on the requirements of a particular experiment, the nature of the liquid medium and sample and the type of data acquired.

Selecting a liquid cell device having a gap between substantially parallel first and second electron-transparent membranes means selecting a liquid cell device having a single given membrane gap, or selecting a single given membrane gap from among a range of membrane gaps present in a single liquid cell device.

In another aspect, wherein the sample comprises a multiplicity of crystals and the method further comprising selecting a liquid cell device having gap between substantially parallel first and second electron transparent membranes that ensures that the multiplicity of crystals have at least a substantially randomly orientation distribution.

A randomly oriented distribution is particularly advantageous for diffraction analysis of low-symmetry crystals, since it allows greater sampling of reciprocal space.

BRIEF DESCRIPTION OF THE FIGURES

To the extent that the figures show different ways of implementing the present invention they are not to be construed as limiting to other possible embodiments falling within the scope of the attached claim set.

DETAILED DESCRIPTION

In the following, a liquid cell device for acquiring high angle tomographic data in a transmission electron beam instrument will be referred to as a "Tomochip" and the technique of acquiring high angle tomographic data from a samples in a liquid medium in a Tomochip and the tomographic reconstruction of such data will be referred to as High Angle Liquid Electron Tomography or "HALET".

Figure 1:
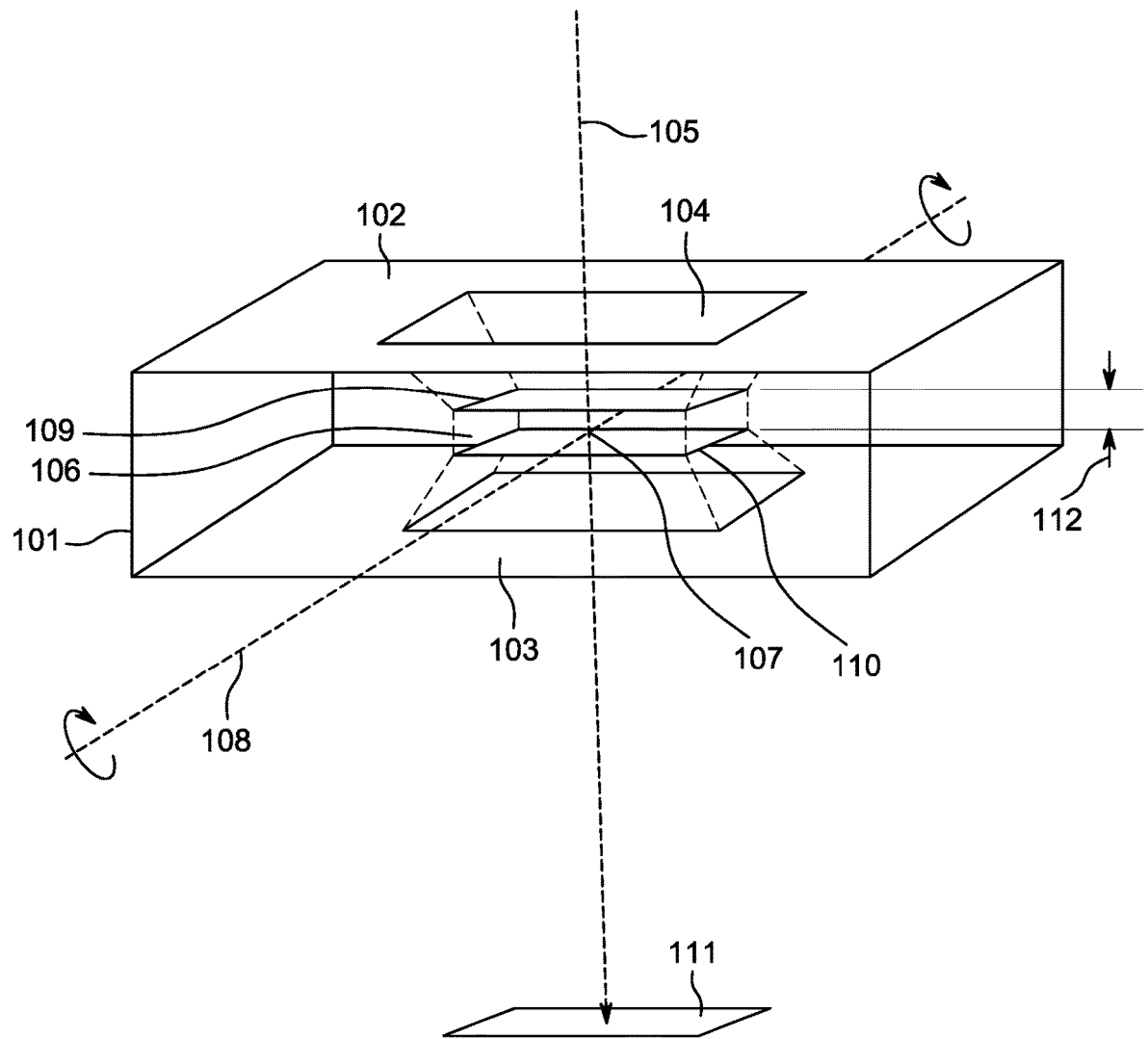
FIG. 1 is a schematic representation of a liquid cell device for acquiring high angle tomographic data in a transmission electron beam instrument.

FIG. 1 is a schematic representation of an embodiment of a Tomochip. Though main body 101 is shown having an overall rectilinear shape, in general, it may take a range of different shapes, as explained in more detail below. For ease of representation, the dimensions shown in FIG. 1, including those of main body 101, have been expanded along the direction marked 105, referred to as the line of sight. The skilled person will appreciate that an upper limit of the lateral dimensions of main body 101 perpendicular to line of sight 105, will depend on the internal dimensions of the specimen holder of the transmission electron beam instrument. For example, TEM and STEM specimen holders are commonly sized to admit a disc having a 3 mm diameter, while an electron diffractometer may accommodate larger samples. In the case of a TEM or STEM instrument, main body 101 will generally be sized for mounting on a 3 mm ring- or aperture-like support, typically but not necessarily made from copper, as commonly used in such instruments. The opposing main body first and second surfaces 102 and 103 will may be separated by around 100 micrometers, as demonstrated in the proof of concept Tomochip described below. However, as further discussed below, the separation between these surfaces may be smaller or larger than 100 micrometers.

Opposing first and second main body surfaces, 102 and 103, are shown as rectangular, planar and parallel, a configuration that may facilitate manufacture and mounting of the main body on a support and loading into the electron beam instrument, but in general need be neither rectangular, planar nor parallel. Main body 101 may be manufactured, for example, using the "MEMS" technology outlined below, to have an outer shape approximating a 3 mm diameter circle, allowing it to fit directly into a TEM and STEM specimen holder without the use of a 3 mm ring- or aperture-like support. Aperture 104 that runs between first and second main body surfaces 102 and 103 is shown as symmetrical, having the same rectangular shape at the first and second main body surfaces with a symmetric profile comprising equally-sized, equally-angled, inwardly-sloping planar walls, such as may be manufactured by etching single crystal silicon, but in general can adopt different forms. Aperture 104 affords a line of sight 105, a notional straight line view between opposing first and second main body surfaces 102 and 103, which intersects liquid accessible volume 106. Volume 106 is thus enclosed by the main body, at least partially contained within the aperture 104 and bounded by first and second at least substantially planar electron transparent membranes 109 and 110, each spanning the aperture and so having an exterior surface that forms a part of an external surface of the liquid cell device and an opposing interior surface abutting the liquid accessible volume. Though not shown in FIG. 1, liquid accessible volume 106 may extend into main body 101 well beyond the edges of electron transparent membrane regions 109 and 110, as far as one or more openings (not shown) in a surface or surfaces of main body 101.

Though first and second electron transparent membranes 109 and 110 are shown as perfectly rectangular and parallel, other membrane shapes may be used, the membranes may be substantially rectangular shaped, and the membranes need not necessarily be perfectly parallel. The aspect ratio and relative separation of first and second electron transparent membranes 109 and 110 is not intended to be scale. For example, as discussed below, substantially parallel and substantially overlapping membranes having a length, measured along a direction parallel to their intersection with a plane perpendicular to the liquid cell device rotation axis, of at least 350 micrometers, a width, measured perpendicular to their length, of no more than 90 micrometers, sufficient to restrain excessive outward bulging during data acquisition, and separated by a gap 112 less than 100 nm or larger than 5000 nm, having a suitably sized main body 101, may allow for tilting over a high angular range while retaining a sufficient projected viewable area. In general, rectangular or close to rectangular membranes so configured with respect to the rotational axis of the liquid cell device, may have a length in even greater proportion to their width, up to 100 times greater. For example, rectangular or close to rectangular membranes up to 2000 micrometers long may be housed in a main body and accommodated in the 3 mm diameter specimen holder commonly used in a TEM or STEM instrument, and yet have a width of as small as 20 micrometers.

As already noted, electron transparent membranes 109 and 110 may have a maximum width that restrains excessive outward bulging of the membranes, up to 90 micrometers, and thus maintain a close to uniform thickness region of liquid medium containing the sample in the transmission electron beam instrument, allowing acquisition of usable tomographic data across a high angular range. The membrane width may be less 10, 20, 30, 40, 50, 60, 70, 80 or 90 micrometers and be sufficient to restrain excessive outward bulging. The skilled person will appreciate that what constitutes usable high angular range tomographic data may depend on the particular experimental conditions employed, such as the composition of the liquid medium and sample, the thickness and composition of the membranes and the type of data acquired. For example, EELS data acquired from samples suspended in a liquid medium may be more sensitive to outward electron transparent membrane bulging that increases the transmitted electron path length than EDS or low magnification image data.

The skilled person will further appreciate that electron transparent membranes able to sufficiently restrain outward bulging may be composed of a suitable low atomic weight, low density material.

Examples of such materials include, but are not limited to, silicon oxide, silicon nitride and graphene. The skilled person will further appreciate that whether a particular electron transparent membrane is able to sufficiently restrain outward bulging will depend on additional factors, including the membrane thickness, shape and size. For example, such a membrane may be composed of SiN having a thickness of around 30 nm or around 10 to 50 nm. For example, such an electron transparent membrane may be of a rectangular or generally rectangular shape and have a width of no greater than 90 micrometers, measured along a direction perpendicular to the intersection of the membrane with a plane perpendicular to the liquid cell device rotation axis. In the proof of concept Tomochip discussed below, for which acquisition of high angular range tomographic data used in tomographic reconstruction is demonstrated, the SiN electron transparent membranes have a thickness of around 30 nm and are 25×300 micrometer rectangles. Other electron transparent membrane shapes and sizes may be used.

In contrast, the 50 nm thick SiN membranes used in Karakulina et al., Nano Lett. vol. 18, no. 10, pages 6286-6291 (2018), which are apparently significantly wider at their narrowest point than 90 micrometers, when filled with a liquid medium, bulged outwardly sufficient to double the gap between membranes. Such severe outward bulging prevents acquisition of usable high angular range data. See Karakulina et al., page 6287, RH column to page 6288, LH column. Further, even if usable high angular range tomographic data could be acquired from such a liquid cell device, the severe outward membrane bulging would effectively prevent the type of gap selection discussed herein.

Though not shown in FIG. 1, liquid accessible volume 106 may be liquidly connected to at least one sealable opening at the surface of the main body by at least one channel that allows the volume to be filled with a liquid medium containing a sample, the liquid medium generally but not necessarily entering by capillary action. For example, liquid accessible volume 106 may form a part of a parallel sided straight channel (not shown) extending between two sealable openings on opposing surfaces of main body 101. In other embodiments, liquid accessible volume 106 may be accessed through a movable portion of main body 101 containing electron transparent membrane 109, allowing liquid to be introduced and then electron transparent membrane 109 secured in place over electron transparent membrane 110. In such an arrangement it may be desirable to include a channel (not shown) to the surface of main body 101, to relieve internal pressure on electron transparent membranes 109 and 110 from liquid medium in liquid accessible volume 106.

Liquid accessible volume 106 contains intersection 107 between the line of sight 105 and substantially perpendicular rotational axis 108 of the liquid cell device, rotational axis 108 being disposed substantially equidistant from the first and second electron transparent membranes, 109 and 110. As shown in FIG. 1, rotational axis 108 may also be disposed substantially equidistant from first and second main body surfaces 102 and 103.

With line of sight 105 disposed normal to the surfaces normal of parallel first and second electron transparent membranes 109 and 110, as shown in FIG. 1, a parallel projection along the line of sight defines a projected viewable area 111, a parallel projection of sealable volume 106, having the same area as electron transparent membranes 109 and 110 when membranes are aligned normal to and centered on line of sight 105, as shown in FIG. 1. The gap between membranes 112 will correspond to the path length through liquid accessible volume 106 of electrons impinging at normal incidence to electron transparent membranes 109 and 110.

FIG. 2B shows a Tomochip main body having an aperture 204, corresponding to, for example, aperture 104 in FIG. 1, electron transparent membranes 209 and 210 correspond to electron transparent membranes 109 and 110 shown in FIG. 1, with parallel lines of sight 221, 231, 241 and 251 passing through the corners of rectangular electron transparent membranes 209 and 210, forming a projected viewable area 211, corresponding to, for example, projected viewable area 111 shown in FIG. 1, having the same area as electron transparent membranes 209 and 210. As shown in FIGS. 2A, rotation around axis of rotation 208 causes a decrease in projected viewable area, from 211 to 218, with corners shown projected along lines of sight 228, 238, 248 and 258, and, as shown in FIG. 2C, rotation by an equal amount in an opposite sense, leads to a corresponding decrease in projected viewable area, from 211 to 219, with corners shown projected along lines of sight 229, 239, 249 and 259. As shown in FIGS. 2A and 2C, the decrease is more than mere geometric projection, once the short sides of electron transparent membranes 209 and 210, corresponding to the intersection with lines of sight 241 and 221 and 251 and 221, begin to be shadowed by the edges of aperture 204. The skilled person will appreciate that, as the liquid cell device is rotated around rotational axis 208, projected viewable areas 218 and 219 will decrease continuously, as a matter of geometry. For example, treating the gap between electron transparent membranes 209 and 210 as negligible, and multiplying the area 211 by cos(tilt angle), with a 60 degree tilt, projected viewable areas 218 and 219 will be around two times smaller than projected viewable area 211 and, with a 70 degree tilt, around three times smaller. The skilled person will further appreciate that, as the tilt angle increases, independent of such geometrical decrease, the projected viewable areas 218 and 219 will eventually be completely obscured by shadows of portions of main body 201 encroaching from the short sides of electron transparent membranes 109 and 110.

Returning to FIG. 1, first and second electron transparent membranes 109 and 110, main body first and second surfaces 102 and 103 and aperture 104 may be configured, that is, sized, shaped and disposed relative to each other, such that, during rotation of the liquid cell device around the rotational axis 108 through an angular range of at least 120 degrees, line of sight 105 through a portion of the liquid accessible volume 106 is maintained over a projected viewable area 111 of at least 10 square micrometers. In general, bearing in mind the shadowing effect noted above in connection with FIG. 2, for a given profile of aperture 106 and a given separation between first and second main body surfaces 102 and 103, increasing the length of electron transparent membranes 109 and 110 will tend to increase the angle of rotation away from normal incidence at which a 10 square micrometer, or a 100 square micrometer, projected viewable area can be maintained.

Another approach that allows tilting over a high angular range is to decrease the separation between first and second main body surfaces 102 and 103, to reduce shadowing by the main body, as noted above in connection with FIG. 2. As a practical matter, bearing in mind the maximum desirable width of an electron transparent membrane needed to maintain rigidity and mechanical integrity, and the maximum length available in a 3 mm diameter specimen holder typical in TEM and STEM, the ratio of width to length of an electron transparent membrane cannot generally exceed 1 to 100.

An example of a configuration of first and second electron transparent membranes 109 and 110, main body first and second surfaces 102 and 103 and aperture 104, in which a minimum projected viewable area 111 of at least 100 square micrometers is maintained while the liquid cell device is rotated around the rotational axis through an angular range of at least 140 degrees, is described below in connection with the proof of concept Tomochip. The skilled person will appreciate that many other configurations are possible, beyond those discussed in detail below.

As a matter of geometry, the path length of electrons traversing the liquid accessible volume 106 will increase continuously, from a minimum of gap 112 between membranes 109 and 110, as the Tomochip is rotated away from normal incidence. The skilled person will appreciate that, depending on factors that include the type of tomographic data collected, composition of the liquid medium, composition and distribution of the sample, and the operating voltage of the transmission electron beam instrument, the usable maximum path length will vary. For example, acquisition of EELS data may require a shorter path length than acquisition of EDS or low magnification image data.

Depending on the experiment to be conducted, the gap between membranes, shown in FIG. 1 as 112 with respect to membranes 109 and 110, may be as small as feasible to allow entry of a liquid medium carrying a sample less than 100 nm, and as large as can still provide usable data, 200, 500, 1000, 2000, 3000, 4000, 5000 nm or larger.

Figure 3:
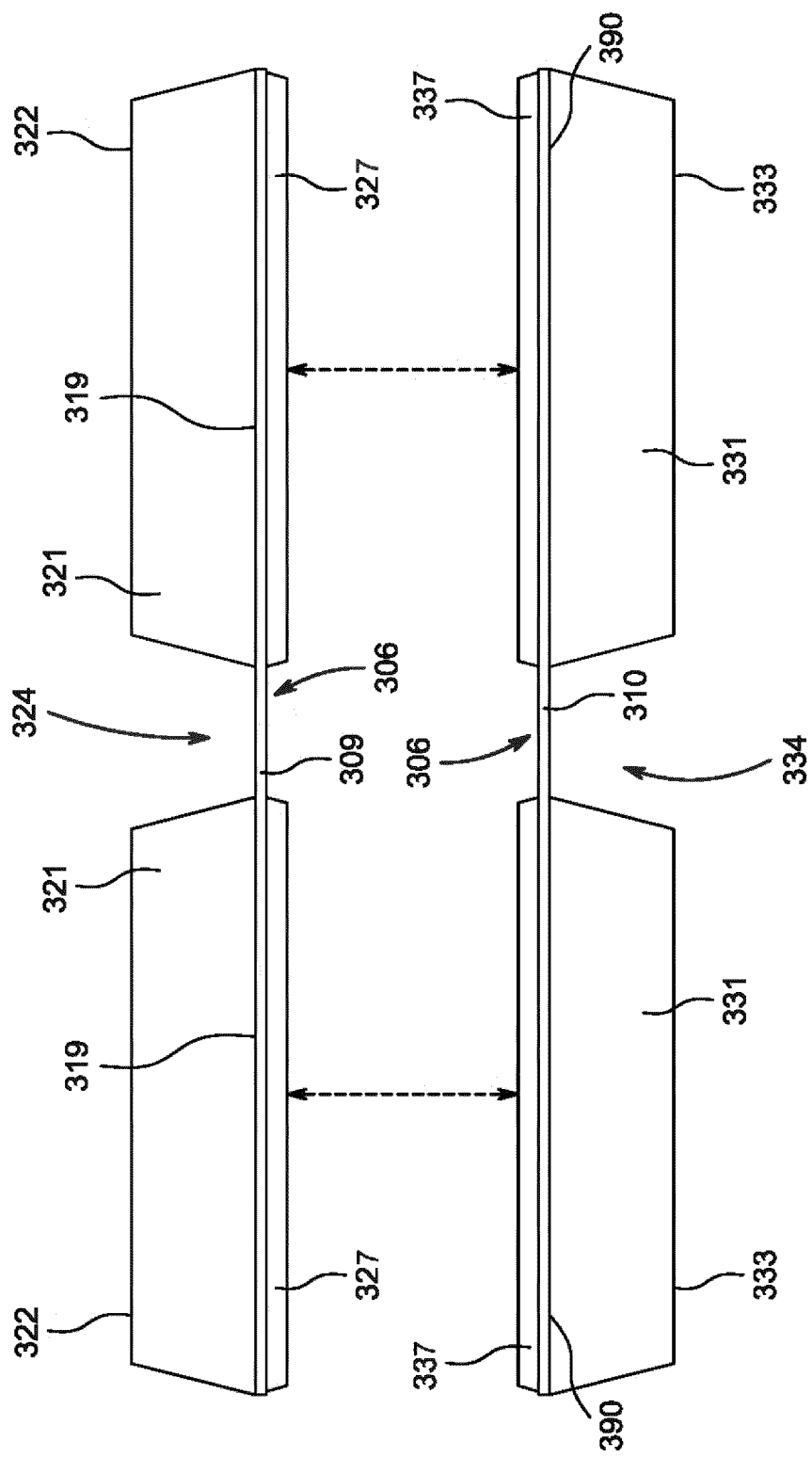
FIG. 3 is a schematic representation of a stage in the fabrication of a liquid cell device for acquiring high angle tomographic data in a transmission electron beam instrument.

FIG. 3 shows a stage in an exemplary process of Tomochip fabrication using the various technologies commonly applied in microelectronics or for fabrication of microelectromechanical systems commonly referred to as "MEMS". Free standing membranes 309 and 310 are shown, together with regions of membrane material 319 and 390 encased by main body portions 321 and 331 and additional layers of material 327 and 337. One or more channels liquidly connected to one or more openings in the surface of the main body are not shown.

In an exemplary process, main body portion 321 is typically formed from a portion of silicon wafer of thickness slightly less than half of the distance between first and second main body surfaces 102 and 103 shown in FIG. 1. A continuous layer of membrane material, 309 and 319, may be deposited onto the front surface of main body portion 321 and an aperture 324 opened from its back surface 322 to expose an area of freestanding membrane 309. Membrane material regions 319 may then be capped with additional layers of a material 327, typically comprised of silicon oxide, which surround space 306 abutting the area of freestanding membrane 309. Likewise, main body portion 331 is typically formed from a portion of silicon wafer of thickness slightly less than half of the distance between first and second main body surfaces 102 and 103 shown in FIG. 1. A continuous layer of membrane material, 310 and 390, may be deposited onto the front surface of main body portion 331 and an aperture 334 may then be opened from its back surface 333 to expose an area of freestanding membrane 310. Membrane material regions 390 may then be capped with additional layers of a material 337, typically comprised of silicon oxide, which surround space 306 abutting the area freestanding membrane 310. A Tomochip main body, corresponding to, for example, 101 in FIG. 1, may then be assembled by joining silicon oxide portions 327 and 337, as shown by the dotted arrows, and thus also connecting together main body portions 321 and 331 comprising freestanding membrane portions 309 and 310, thus forming from spaces 306 into a liquid accessible volume, corresponding to, for example, 106 shown in FIG. 1. The skilled person will appreciate that main body portions 321 and 331 may be formed from different areas of the same silicon wafer and may be processed in parallel.

The skilled person will further appreciate that MEMS processing may involve ultrathin wafers, of the order of 100 micrometers in thickness, or wafers that are reduced to that thickness during processing. The skilled person will further appreciate that MEMS processes need not require bonding of membranes formed on different wafers or on different regions of the same wafer, such as the bonding process shown schematically in FIG. 3 and discussed above, a single wafer process may be used to produce a liquid cell device such as those discussed herein, including that shown in FIGS. 9A and 9B.

Figure 2:
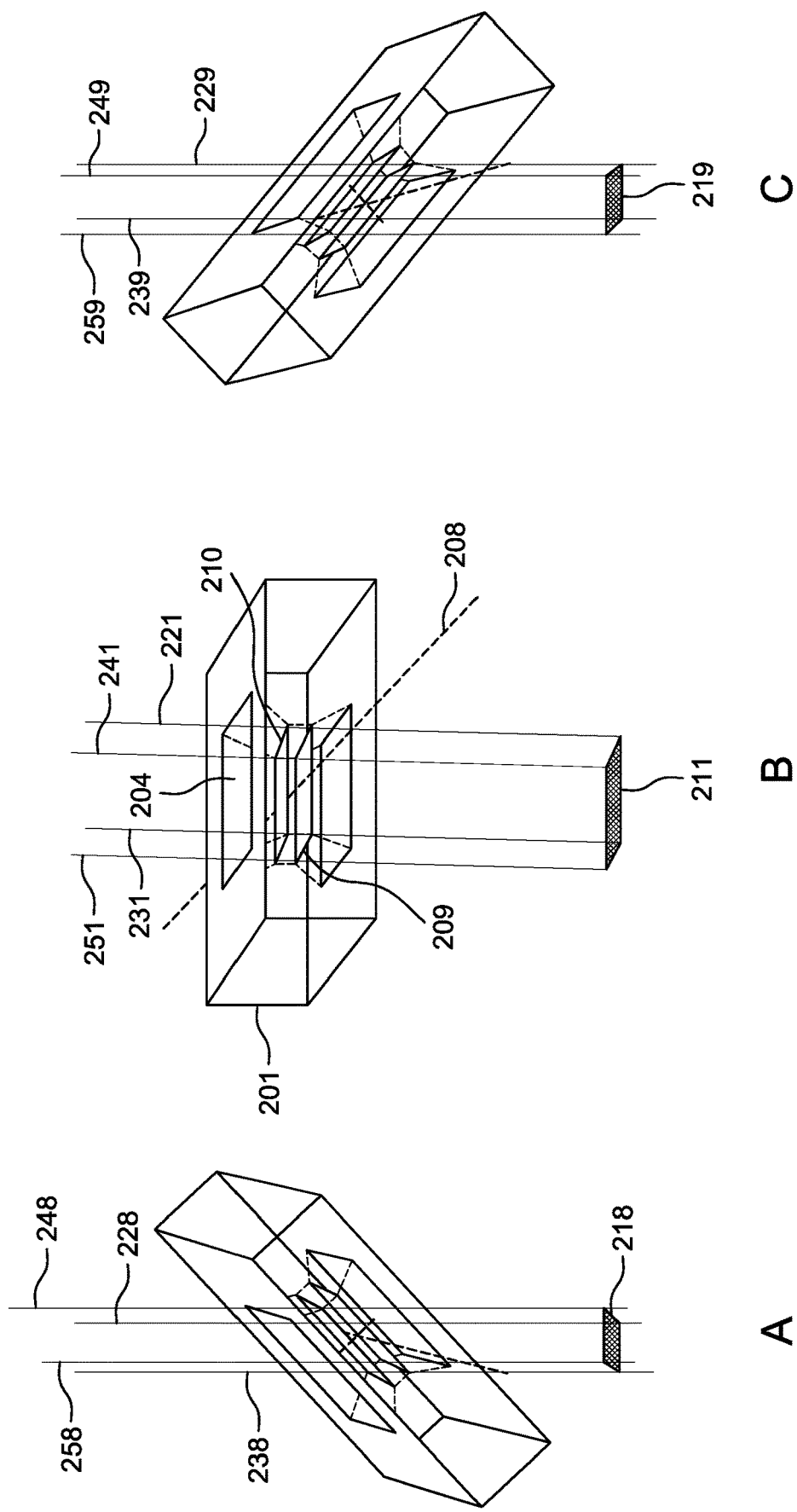
FIGS. 2A, 2B and 2C are schematic representations of tilting of the liquid cell device for acquiring high angle tomographic data in a transmission electron beam instrument.

An advantage arises from the intrinsic high precision of MEMS technology that allows for precise relative alignment of the first and second membranes and thus maximizes the projected viewable area. A further advantage of MEMS processing is that a Tomochip may be formed having a main body and liquid accessible volume or volumes having a variety of shapes, and with more than the single pair of rectangular electron transparent membranes defining a single rectangular viewing window, as shown in FIGS. 1 and 2.

Figure 4:
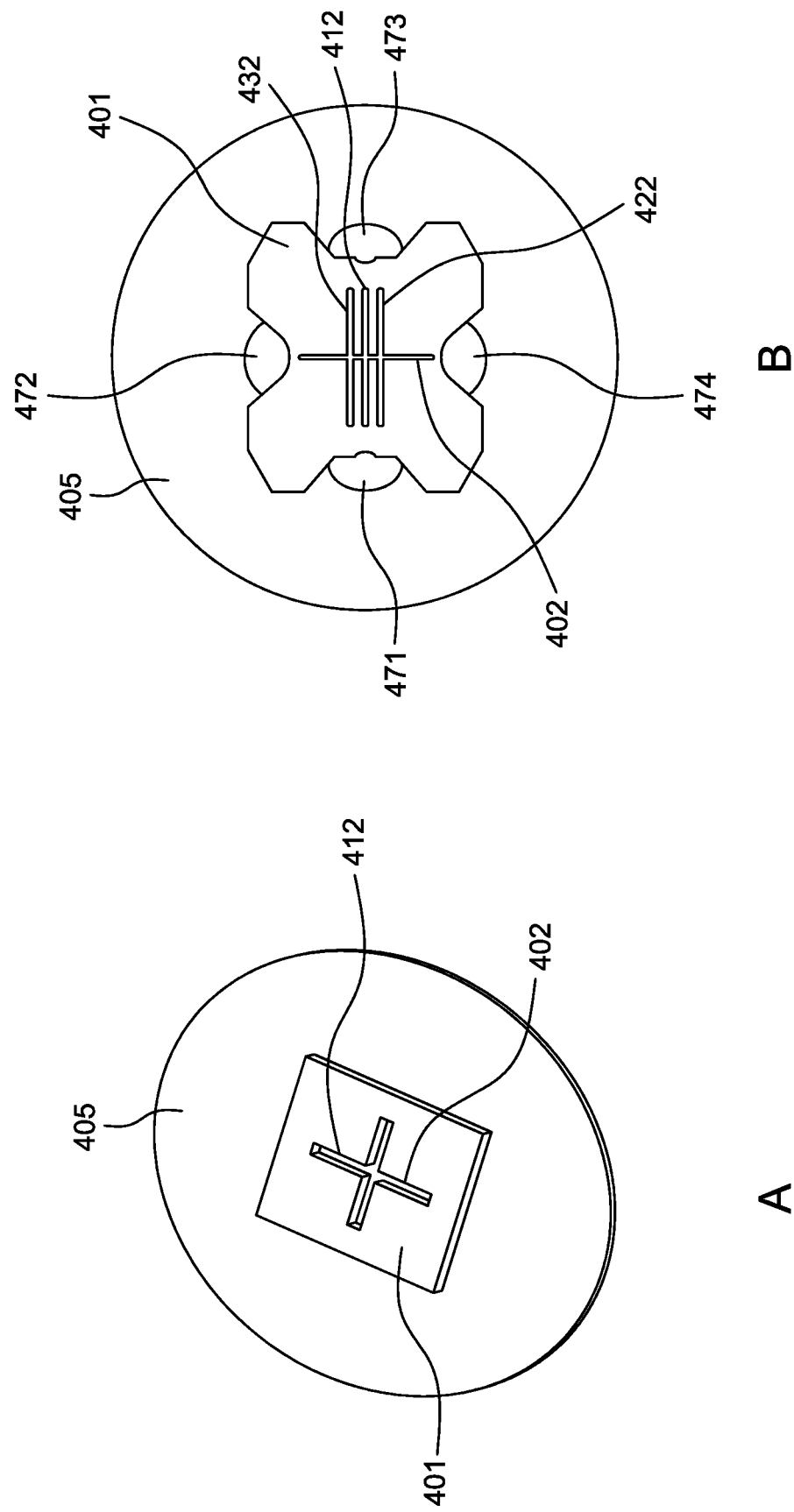
FIGS. 4A and 4B are schematic representations of a liquid cell device for acquiring high angle tomographic data mounted for loading into a transmission electron beam instrument.

FIG. 4A shows a Tomochip comprising a square main body 401 having a rectangular window 402 intersecting an equal-length orthogonal rectangular window 412, making it suitable for use in a so-called tilt-rotation TEM specimen holder that allows for equal tilting around orthogonal rotational axes, the term window being used to refer to a pair of electron transparent membranes aligned to allow an electron beam to pass through at least a portion of a liquid accessible volume, corresponding to, for example, electron transparent membranes 109 and 110 shown in FIG. 1. However, the length of rectangular windows 402 and 412 need not be equal, making the Tomochip suitable for use in a more standard-type TEM specimen holder that allows a large tilt range around one particular rotational axis and a much smaller tilt range around an orthogonal axis. A Tomochip as shown in FIG. 4A could be rotated across equal tilt ranges about two orthogonal axis, running parallel to the directions of windows 402 and 412, and thus be used to obtain tomographic data around two orthogonal axis of rotation from the sample in a liquid medium disposed at the intersection of windows 402 and 412. Main body 401 is shown mounted on a ring-like support 405, which eases handling of the fragile Tomochip and fits securely into a standard 3 mm diameter specimen holder of the type used in most TEM and STEM instruments. Bearing in mind the limits of a 3 mm diameter specimen holder used in such instruments, the length of window 402 and 412 may be limited to no more than about 2 mm. A maximum window length of about 2,000 micrometers would allow for a main body thickness as large as around 200 micrometers and still accommodate tilting over a high angular range, above a total of 120, 130 or 140 degrees, while maintaining a projected viewable area of at least 10 or 100 micrometers squared, with the maximum accessible tilt range depending to some extent on the precise aperture profile.

FIG. 4B shows a Tomochip having main body 401, irregular shaped for reasons explained in connection with FIG. 5 below, having a rectangular window 402 and three equal-length orthogonal intersecting windows 412, 422 and 432. Such a configuration allows for orthogonal axis tomography on three separate regions of sample in a liquid medium. Main body is again shown mounted on a support ring 405. Features 471, 472, 473 and 474 may seal openings (not shown) in the surface of main body 401 that are liquidly connected to liquid accessible volumes of windows 402, 412, 422 and 432. As discussed below in connection with FIG. 5, a pair of openings (not shown), each opening sealed by features 471 and 473, respectively, may be connected by a single channel of sufficient width to form a single liquid accessible volume associated with all three windows 412, 422 and 432, and a pair of openings (not shown) sealed by features 472 and 474, respectively, may be connected by a single channel significantly wider than the width of window 402.

Figure 5:
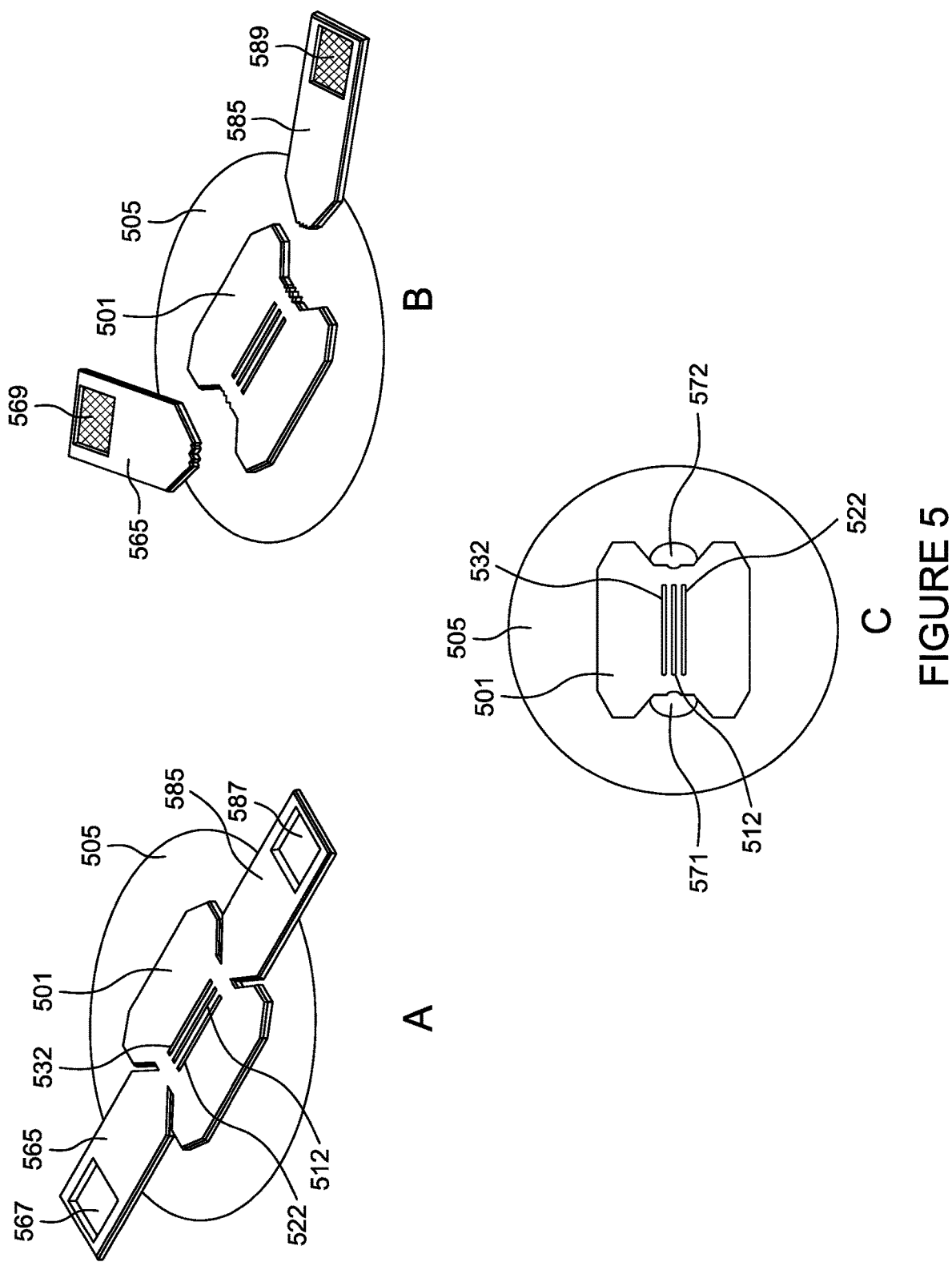
FIGS. 5A, 5B and 5C are schematic representations of stages in the introduction of a liquid medium into a liquid cell device for acquiring high angle tomographic data in preparation for loading into a transmission electron beam instrument.

FIG. 5 shows a Tomochip having a main body 501 comprising three parallel rectangular windows 512, 522 and 532, the term window again being used to refer to a pair of electron transparent membranes. Removable filling portions 565 and 585 house reservoirs 569 and 589, respectively, suitable for receiving a liquid medium containing a sample. Reservoirs 569 and 589, are connected via openings (not shown) leading to channels through which liquid can flow from the reservoirs to windows 512, 522 and 532. When a liquid medium is introduced into one or both reservoirs, the liquid medium may be drawn by capillary action into the window regions housing the liquid accessible volumes, as described in detail above, from which tomographic data may be obtained. FIG. 5B shows the removable filling portions having been mechanically removed, their narrowing at their intersection with main body 501 facilitating such removal. FIG. 5C shows features 571 and 572 that seal the open ends of channels exposed when the extension portions were removed. Though not as shown in FIG. 5, each of three channels, which may be straight, may be liquidly connected to an opening blocked by sealing feature 571 and an opening blocked by sealing feature 572, giving a total of six openings, one at each end of each channel, each of the three channels forming, in part, the liquid accessible volume associated with each of the three windows 512, 522 and 532. As an alternative, as discussed below in connection with embodiments having variable electron transparent membrane gaps, a single opening blocked by sealing feature 571 and a single opening blocked by sealing feature 572, each opening liquidly connecting to a channel that divides into three channels that form, in part, each of the liquid accessible volumes associated with the three windows 512, 522 and 532. As another alternative, a single channel may extend between openings at 571 and 572 but be of sufficient width to form a single liquid accessible volume associated with all three windows 512, 522 and 532. The skilled person will appreciate that other configurations of channels and opening are possible with three parallel windows, as are embodiments with more than three parallel windows. Though also not as shown in FIG. 5, a Tomochip with only one removable filling portion may be used, if the fillable portion comprised two reservoirs, each comprising an opening liquidly connected to different ends of each liquid accessible volume, or even a single reservoir comprising a pair of openings, each liquidly connected to different ends of each liquid accessible volume.

An advantage of using such removable filling portions is that it avoids the liquid medium containing a sample from accidentally flowing from an opening across the main body and contaminating the electron transparent membrane outer surfaces with the liquid medium and sample.

FIGS. 9A and 9B show schematic top surface and angled views of a multi-window liquid cell device manufactured by a MEMS process, particularly a single wafer MEMS process. This "top" surface need not be upward facing when data is acquired from the liquid cell device in a transmission electron beam instrument. As discussed above, in connection with FIGS. 1, 2, 4 and 5, main body 901 may be sized to fit directly into a standard 3 mm diameter specimen holder, of the type often used in transmission electron beam instruments. Though main body 901 is shown as having an octagonal shape, other shapes, including circular and close to circular, may be used. Typically, but not necessarily, main body 901 is composed of silicon.

Main body 901 comprises an edge portion 912, having a typically uniform thickness of around 150 micrometers, and a central portion 922, having a typically uniform thickness, except as discussed below, and a top surface typically recessed around 50 to 75 micrometers below the top surface of edge portion 912. The bottom surface of central portion 922 (not visible) may also be recessed. Central portion 922 includes, on its top surface, tracks 931 and 932, typically but not necessarily composed of silicon nitride, each track containing, within its thickness, two of four parallel elongated windows, 905 and 909 in track 931 and 903 and 907 in track 932. The top surface of tracks 931 and 932 may be recessed below, raised above or parallel to the surface of central portion 922. The term window is again used to refer to a pair of at least substantially parallel and planar electron transparent membranes spanning and sealing an aperture in the main body, separated by a gap and enclosing at least a portion of a liquid accessible volume. As discussed above, in connection with FIG. 1, the apertures between the top and bottom surfaces of central portion 922 may be formed in single crystal silicon using anisotropic etching techniques and so may have four planar, possibly inclined, walls extending from each surface.

Central portion 922 and tracks 931 and 932 may, but need not necessarily, be configured to dispose elongated windows 903, 905, 907 and 909 at the midpoint between the top and bottom surfaces of edge portion 921. Aside from apertures extending between the top and bottom surfaces of central portion 922, each allowing a line of sight through main body 901, corresponding to windows 903, 905, 907 and 909, the central portion 922 may also be reduced in thickness underneath or in the vicinity of tracks 931 and 932. In any event, each of elongated windows 903, 905, 907 and 909 may be disposed to contain, typically approximately halfway along each of their lengths, rotational axis 908. The electron transparent membranes in elongated windows 903, 905, 907 and 909 are typically composed of silicon nitride and around 25 nm or 30 nm in thickness, though a membrane thickness between around 10 to 100 nm in thickness may be used. The gap between electron transparent membranes in elongated windows 903 and 905 may be typically around 1 micrometer, and the gap in elongated windows 907 and 909 may be typically around 0.12 micrometers. As already noted, other gaps may be employed, the gaps in elongated windows 907 and 909 may be different from each other, and the gaps in elongated windows 903 and 905 may also be different from each other.

Within track 931, a first liquid accessible channel or volume (not visible) extends between sealable openings 943 and 945, including a portion of first liquid accessible volume within window 905, and a second liquid accessible volume (also not visible) extends between sealable openings 941 and 947, including a portion of second liquid accessible volume within window 909. Similarly, within track 932, a third liquid accessible channel or volume (not visible) extends between sealable openings 944 and 946, including a portion of third liquid accessible volume within window 903, and a fourth liquid accessible volume (also not visible) extends between sealable openings 942 and 948, including a portion of fourth liquid accessible volume within window 907.

Though not shown in FIGS. 9A and 9B, raised barrier portions may be provided to separate the areas of the top surface of central portion 922 surrounding each pair of liquid accessible openings, 941 and 943, 945 and 947, 942 and 944, and 946 and 948, from the remaining area of the top surface of thinner central portion 922 containing elongated windows 903, 905, 907 and 909, and reference window 999 (discussed below). The raised barrier portions being adapted to prevent liquid from spilling onto and contaminating the electron transparent membranes while the respective liquid accessible volumes are being filled and before the sealable opening are sealed. The liquid cell device shown in FIGS. 9A and 9B may be adapted to include other configurations of independently fillable liquid accessible volumes, sealable openings and windows. Though also not shown in FIGS. 9A and 9B, the sealable openings, and any optional raised barrier portions, need not be located on the same surface of thinner central portion 922 on which tracks 931 and 932 are visible, but may be located on the opposite surface. In which case, the "bottom" surface of central portion 922, not shown in FIGS. 9A and 9B, would become the location of the sealable openings, each connected via a channel through the, typically silicon, central portion 922 to a corresponding liquid accessible volume. The skilled person will appreciate that, independent of their actual location on the surface of main body 901, each pairs of sealable openings may be sized to accommodate the introduction of a single liquid drop.

The first and second liquid accessible channels within track 931 may be combined to form a single liquid accessible channel that includes windows 905 and 909. Similarly, the second and third liquid accessible channels within track 931 may be combined to form a single liquid accessible channel that includes windows 903 and 907. In such cases, the pairs of sealable openings, 941 and 943, 945 and 947, 942 and 944, and 946 and 948, may each be combined to form a total of four sealable openings, two sealable openings in each of tracks 931 and 932, or on the bottom surface of central portion 922, as discussed above.

Windows 907 and 909 may each be around 10 micrometers wide by 2000 micrometers long. The skilled person will appreciate that, in combination with an edge portion 912 thickness of around 150 micrometers and windows located at least relatively close to the mid-point of the thickness of the edge portion 912, this results in a liquid cell device capable of maintaining a projected viewable area of at least 10 square micrometers in windows 907 and 909 during rotation of the liquid cell device away from normal incidence around rotational axis 908 by an angular range of ±80° (160° total). Windows 903 and 905 may each be 20 micrometers wide by 800 micrometers long, which similarly results in a liquid cell device capable of maintaining a projected viewable area of at least 10 square micrometers in windows 903 and 905 during rotation of the liquid cell device away from normal incidence around rotational axis 908 by an angular range of ±70° (140° total). A thicker edge portion 912 may be used, but with the effect of decreasing the angular range over which the liquid cell device can be rotated, and a projected viewable area of at least 10 micrometers squared maintained, without shadowing by main body 901.

Reference window 999, not associated with a liquid accessible volume but optionally intersected by rotational axis 908, may be included for purposes of calibrating the transmission electron beam instrument. Reference window 999 need not be rectangular, for example, it may be a square with around 150 micrometer long sides, and one or both electron transparent membranes need not be present.

Liquid cell devices as described herein can be used to perform high angle liquid electron tomography ("HALET") using any type of data that can be acquired in a transmission electron beam instrument across a high angular tilt range. The data type may be selected according to the requirements of a particular experiment, limited only by the data acquisition capabilities and available operating modes of a particular instrument. For example, tomographic data can include X-ray EDS data or can be acquired from electrons transmitted through the sample, such as EELS, diffraction, including precession electron diffraction, or imaging data, including holographic data showing electric.

Such high angular range data, generally in the form a tilt series obtained while the liquid cell device is tilted about its rotation axis through a high angular range, generally from one end of the range to the other, can be used for tomographic reconstruction. Such tomographic reconstruction may be done using a range of proprietary/commercial software packages (IMOD, Tomoi, EM3D Amira, Image Pro Discovery, etc.) to reveal the three-dimensional internal structure of at least a portion of a sample in a liquid medium. As illustrated by the below examples, the internal structure includes the three-dimensional distribution of sample objects in the liquid medium and the internal structure of those sample objects. The size range of samples that may be investigated using a Tomochip can vary from the nanometer scale up to as large as can be introduced using a liquid medium and accommodated in a given electron transparent membrane gap.

A surprising advantage of the Tomochip is its enablement of selection of an electron transparent membrane gap to ensure that a substantial fraction of the sample in a liquid medium remains sufficiently immobile during the data acquisition over a high angular range to allow reliable tomographic reconstruction. This capability may be particularly useful for samples that take the form of nm to micrometer sized objects, including size ranges that would normally be expected to exhibit Brownian motion or to move during high angle tilting, thus impairing the acquisition of high angle tomographic data. These capabilities are further described and illustrated below.

A further advantage of the Tomochip is that an electron transparent membrane gap can be selected to allow diffraction investigation of a multiplicity of crystalline samples having at least a substantially randomly orientation distribution. Such a substantially random orientation distribution can be beneficial for investigations of organic or inorganic crystalline samples, whether or not the liquid medium is needed to maintain sample integrity, and may be preferable to sample preparation using a solid support that may inherently give rise to a preferred crystalline orientation or texture. Such a substantially random orientation distribution, in combination with high angular range data acquisition, can be particularly beneficial for investigation of low symmetry crystals, those for which data acquisition over a large fraction of reciprocal space, e.g., tilting the sample over a range of at least 120 degrees, may be required in order to obtain reliable structure analysis. Using the Tomochip, a substantially random orientation distribution can be obtained from any suitably sized crystalline sample that is compatible with a liquid medium. The Tomochip thus has certain advantages over the recently proposed polymer embedding technique for orientation randomization of samples investigated in electron diffractometers. Wennemacher et al., Nature Comm., v. 10, Article number: 3316 (2019).

Figure 9:
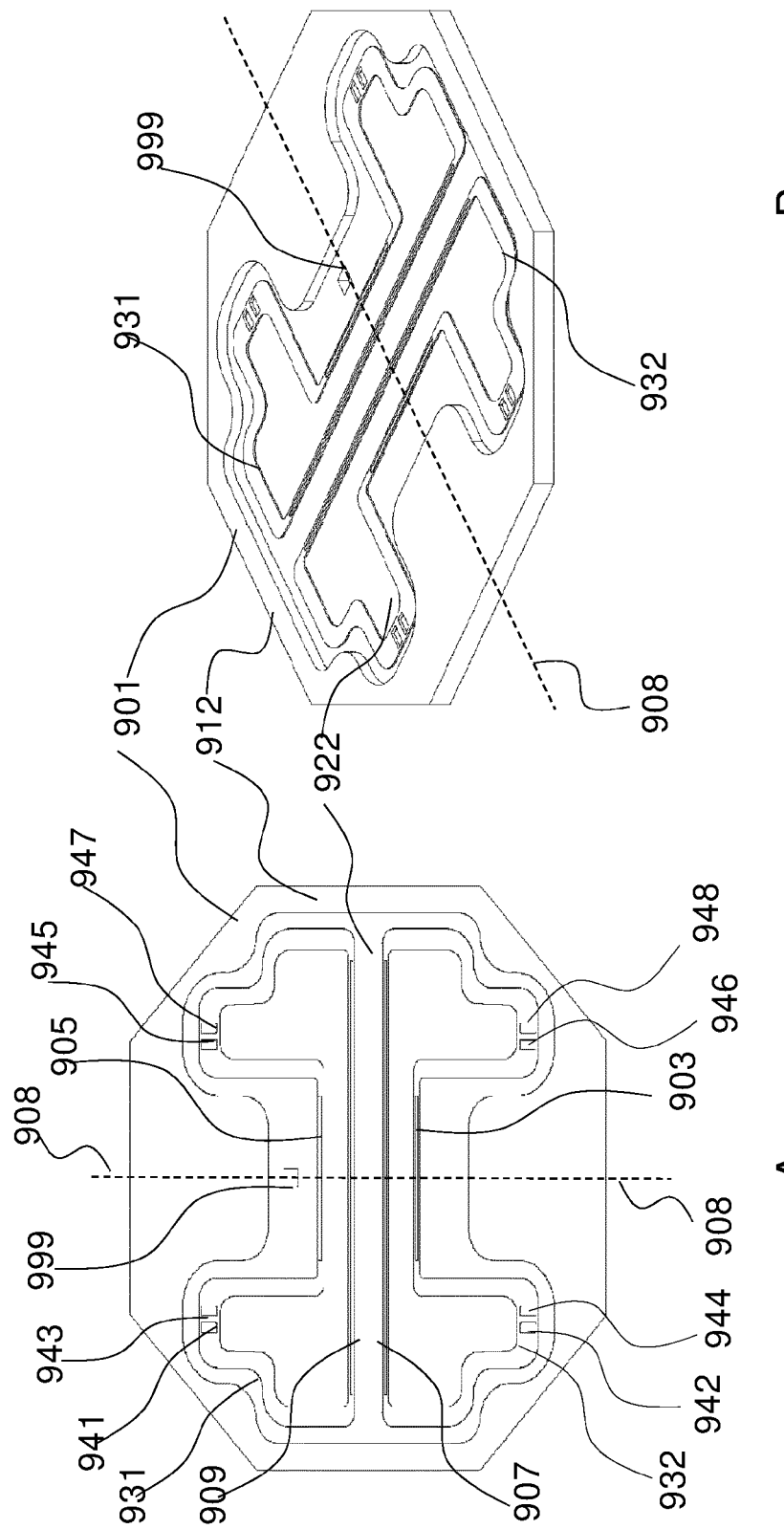
FIGS. 9A and 9B are schematic representations of a liquid cell device for acquiring high angle tomographic data.

Multiwindow Tomochips of the type of shown schematically in FIGS. 5A, 5B and 5C, and also FIG. 9, may be configured to facilitate selection of membrane gaps for particular samples to ensure substantial immobility or a substantially random orientation distribution. For example, a several-window Tomochip could be configured to have a single opening for introduction of a sample in a liquid medium, the opening liquidly connected to multiple parallel rectangular windows each with a different membrane gap. Such a configuration would allow rapid selection of the gap most appropriate for investigation of a particular sample.

Proof of Concept Tomochip and Halet

As a proof of concept, commercial K-Kit cells obtained from MA-TEK of Taiwan were mechanically modified to create a Tomochip and to perform HALET investigations to samples in a liquid medium. Such cells include a pair of SiN rectangular membranes, each 25×300 micrometers, separated by a fixed gap of between 100 and 5000 nm. The pair of electron transparent membranes are located in the center of a silicon body. As noted above, when such a K-Kit is tilted to around ±40° in a TEM, the silicon body entirely blocks the transmission of electrons through the liquid medium and sample located between electron transparent membranes, such that data cannot be acquired at higher tilt angles.

The skilled person will appreciate that the fragility of the around 30 nm thick SIN membranes makes any mechanical modification of a K-Kit silicon body a delicate and difficult process. The resulting Tomochip, having an only around 100 micrometer thick silicon body containing a liquid accessible volume liquidly connected to openings at the silicon body surface is also inherently fragile.

Figure 6:
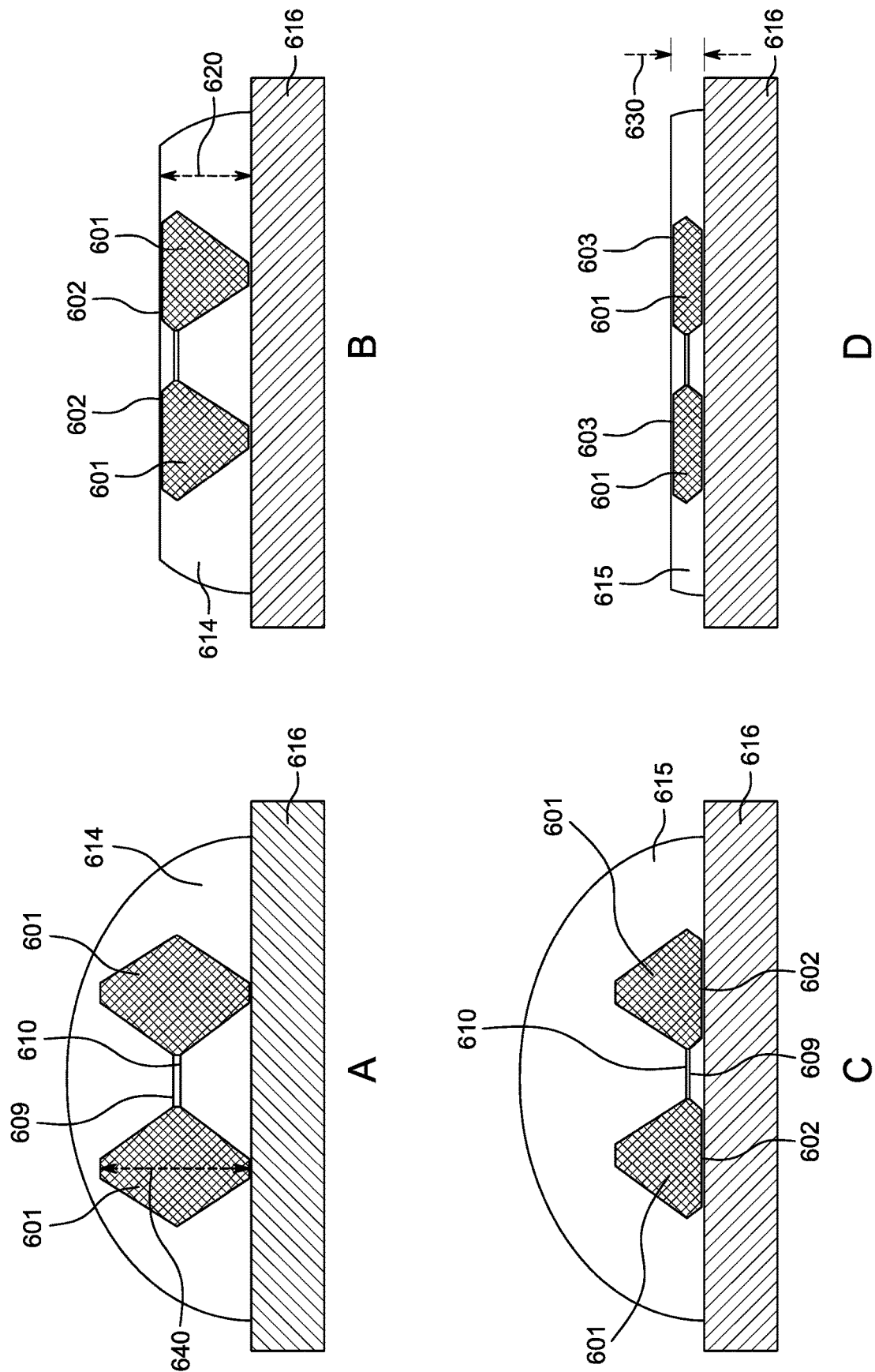
FIGS. 6A, 6B, 6C and 6D are schematic representations of stages in the fabrication of a proof of concept liquid cell device for acquiring high angle tomographic data in a transmission electron beam instrument.

FIGS. 6A, B, C and C are schematic representations of stages in the modification of a K-Kit to form a Tomochip. The section in each of FIGS. 6A to D runs along the length of K-Kit cell, with electron transparent membranes 609 and 610, each around 300 micrometers in length. The vertical gap (not marked) between electron transparent membranes 609 and 610, a fixed distance between 100 and 5000 nanometers, is not intended to be to scale.

FIG. 6A shows a section through a K-Kit silicon body 601 mounted in thermal wax 614, or equivalent, and secured to a surface 616 in preparation for mechanical removal of silicon material from body 601. The skilled person will appreciate that the thermal wax, or equivalent, must be amenable to removal using a solvent that interacts with neither silicon, nor silicon oxide, nor silicon nitride. An example of such a wax is Crystalbond™ 509 manufactured by Aremco Products, which is soluble in acetone. The vertical height 640 of the unmodified K-Kit shown in FIG. 6A is around 800 micrometers.

The skilled person will appreciate that micro-removal can be done in a variety of ways, using a variety of different precision grinding/polishing systems. FIG. 6B shows the K-Kit after precision micro-mechanical removal of approximately 350 micrometers of K-Kit silicon body 601 and surrounding thermal wax 614, leaving a vertical thickness 620 of around 450 micrometers of K-Kit silicon body 601, with electron transparent membranes 609 and 610 encased within thermal wax 614. Exposed silicon surfaces 602 will form part of the surface of the Tomochip, corresponding to, for example, surface 102 shown in FIG. 1.

In between FIG. 6B and FIG. 6C, the partially modified K-Kit is separated from surface 616 and thermal wax 614 removed by dissolution in acetone, with optional removal of any residual silicon fragments adhering to the surfaces of electron transparent membranes 609 and 610 using KOH solution, for example aqueous 30% KOH by weight at room temperature for 6-9 minutes. The modified K-Kit is then inverted and mounted on surface 616 in thermal wax 615 with electron transparent membrane 609 facing downward. At this stage it may be advantageous to use a surface with a matching groove in surface 616 (not shown) directly underneath electron transparent membrane 609, to minimize stress. FIG. 6D shows the result of precision micro-mechanical removal of another approximately 350 micrometers of K-Kit silicon body 601 and surrounding thermal wax 614, leaving a vertical thickness 630 of less than 100 micrometers of K-Kit silicon body 601. Exposed silicon surfaces 603 will form part of the surface of the Tomochip, corresponding to, for example, surface 103 shown in FIG. 1. The Tomochip can then be separated from surface 616 and thermal wax 615 removed by dissolution in acetone, with optional removal of any residual silicon fragments adhering to the surfaces of electron transparent membranes 609 and 610 using KOH solution. The cleaned Tomochip can then be mounted on a ring- or aperture-like support of the type shown in FIGS. 4 and 5 above.

Figure 7:
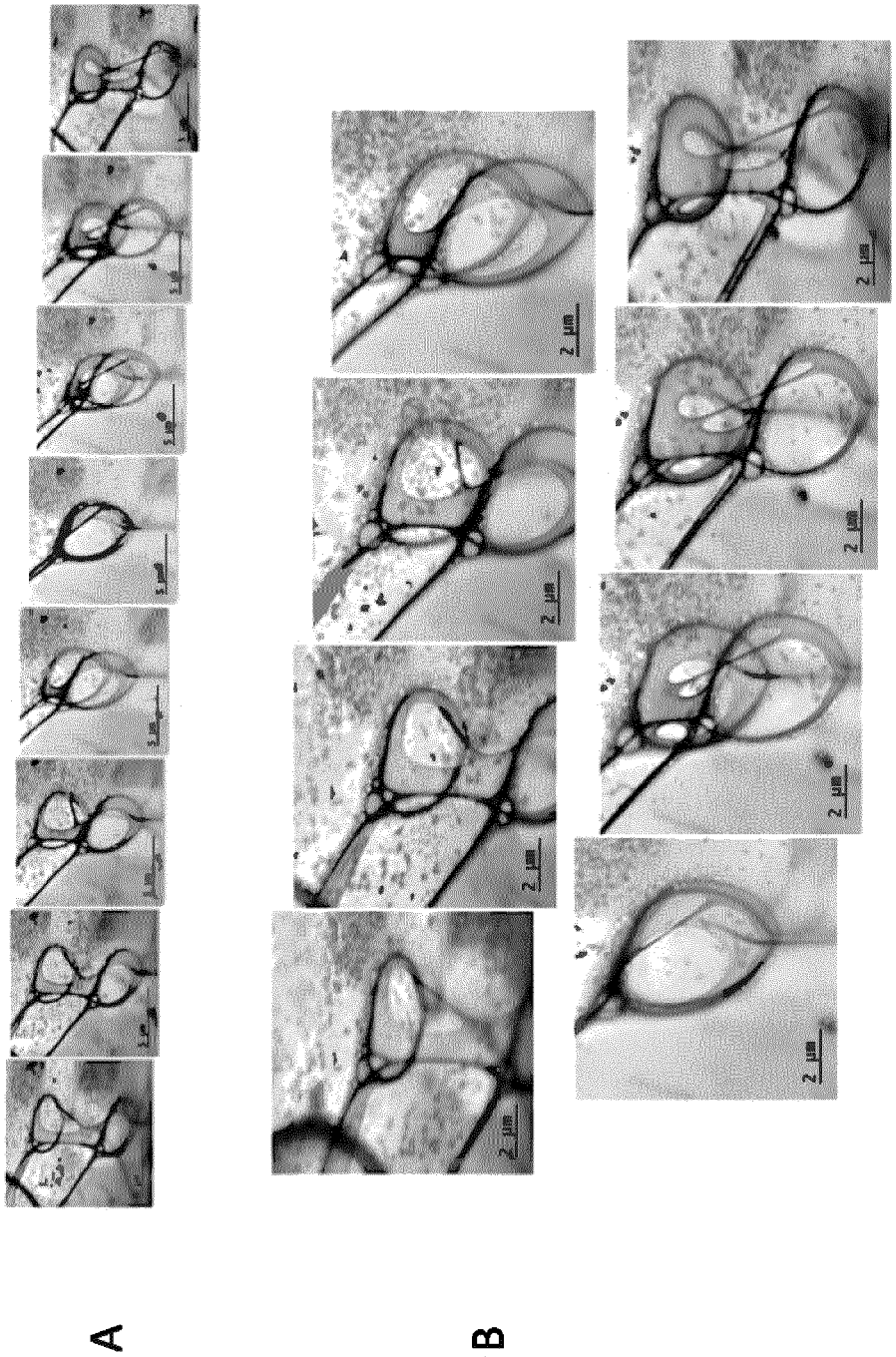
FIG. 7 shows a series of TEM images of micellar water acquired using a proof of concept liquid cell device over an approximately 140° tilt range.

FIG. 7 shows a series of eight images acquired from a micellar water in a Tomochip prepared as described above and having a membrane gap of 2000 nm. The images were obtained in a JEOL 1400 plus TEM operating at 100 kV. FIG. 7A shows a lower magnification view, and FIG. 7B higher magnification, over a total tilt range of approximately 140°, each image separated by approximately 20° of tilt. Structural details can be seen to change during rotation, with the separation of features at the ends of the tilt range that overlap at the center of the range. The image features also appear stable over the entire tilt range. Such images taken over a 140° tilt range are suitable for high resolution tomographic reconstruction.

Figure 8A:
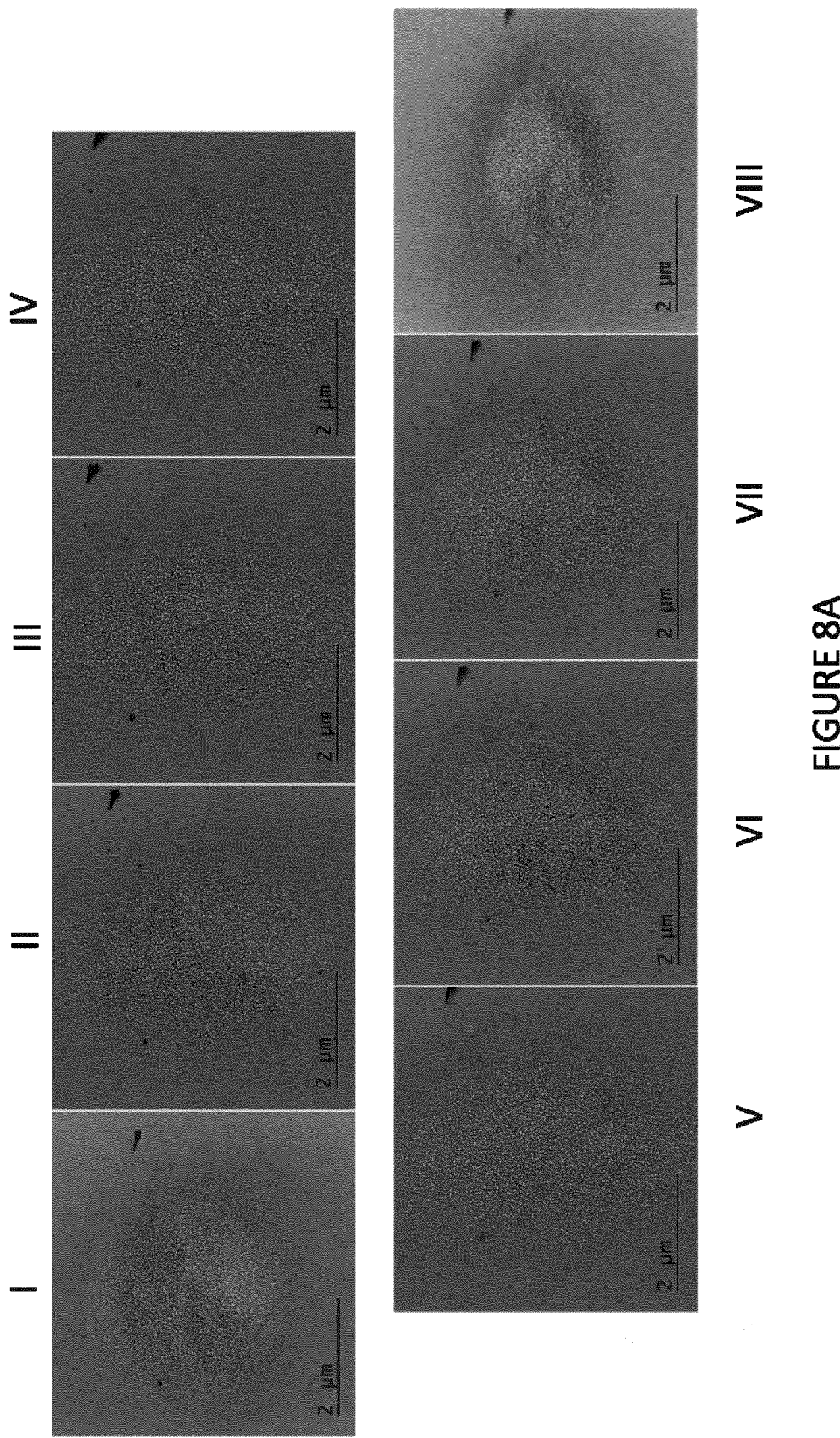
FIG. 8A shows a series of TEM images of bubbles in water acquired using a proof of concept liquid cell device over an approximately 140° tilt range.
Figure 8B:
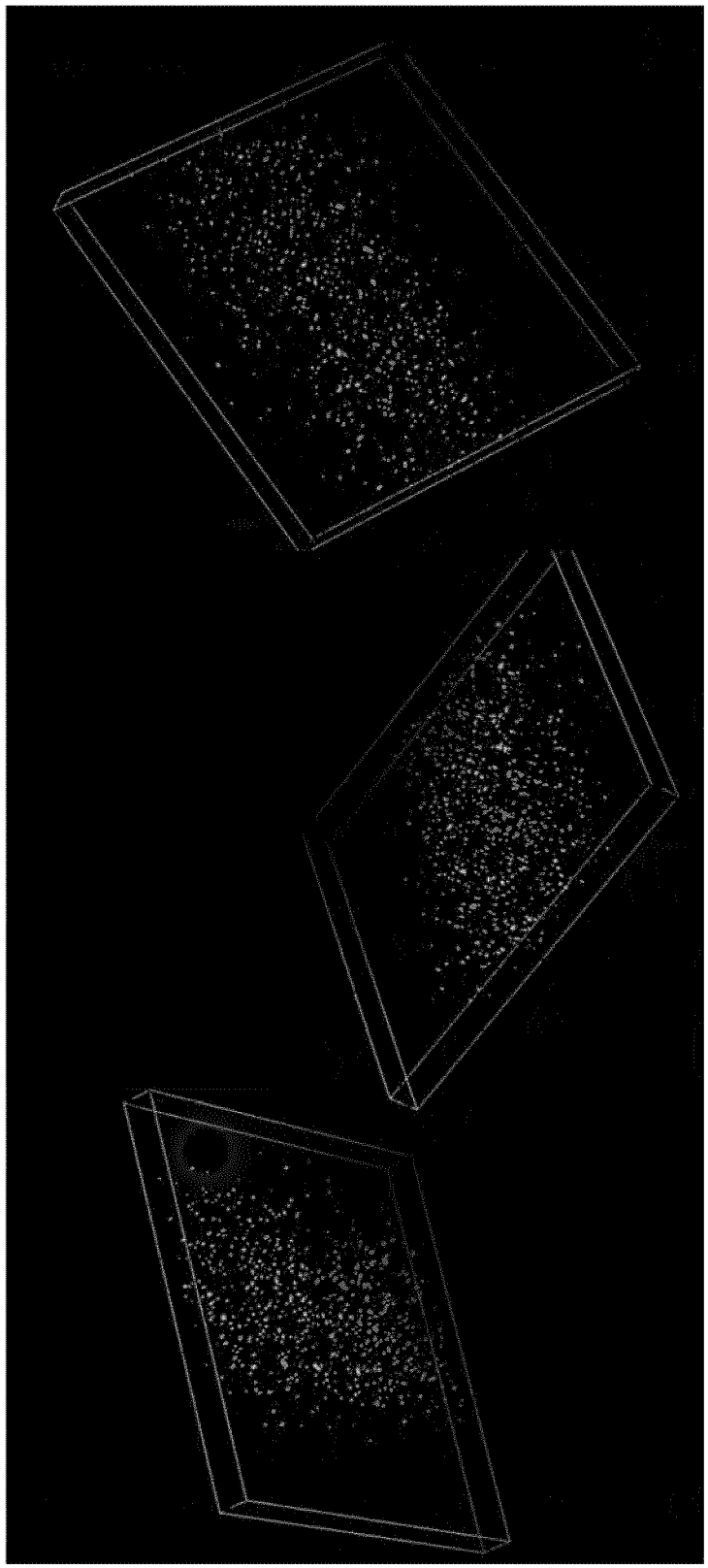
FIG. 8B show views of a tomographic reconstruction of the images of bubbles in water shown in FIG. 8A.

FIG. 8 shows an example of image data taken from an array of bubbles in liquid water, formed in situ by irradiating the sample with a highly focused electron beam, using a Tomochip prepared as described above and having a membrane gap of 200 nm. The microscope voltage was 100 kV and the tilt range is again approximately 140°. FIG. 8A shows the image series I to VIII acquired over the approximately 140° total tilt range, each image separated by approximately 20° of tilt. FIG. 8B shows an example of tomographic reconstruction from the data, with perspective views of the imaged bubbles showing structural detail, including the shape of individual bubbles and their distribution within the depth of the Tomochip gap, information that is not accessible in a single image projection view.

Although the present invention has been described in connection with the specified embodiments, it should not be construed as being in any way limited to the presented examples. The scope of the present invention is set out by the accompanying claim set. In the context of the claims, the terms "comprising" or "comprises" do not exclude other possible elements or steps. Also, the mentioning of references such as "a" or "an", etc., should not be construed as excluding the plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method for acquiring high angle tilting tomographic data in a transmission electron beam instrument from a sample in a liquid medium, the method comprising:
   introducing the sample in a liquid medium into a liquid accessible volume of a liquid cell device, the liquid cell device comprising:
      a main body comprising opposing first and second main body surfaces and an aperture affording a line of sight between the first and second main body surfaces and establishing a viewable area parallel projected along the line of sight through the aperture;
      the liquid accessible volume being enclosed by the main body and at least partially contained within the aperture, the liquid accessible volume containing an intersection of the line of sight with a substantially perpendicular rotational axis of the liquid cell device; and
      at least substantially planar and parallel first and second electron transparent membranes disposed substantially equidistant from the rotational axis and at least substantially overlapping when viewed along their common surface normal, such that they are separated from each other by a gap measured along their common surface normal, each membrane spanning and sealing the aperture to enclose at least a portion of the liquid accessible volume;

wherein the projected viewable area through a portion of the liquid accessible volume is substantially at a maximum when viewed substantially parallel to the common surface normal of the first and second membranes and is at least around 10 square micrometers when the liquid cell is rotated about the rotational axis by up to 60 degrees away from parallel to the common surface normal;

introducing the liquid cell device into the transmission electron beam instrument;

exposing the sample in the liquid accessible volume to an incident electron beam generated in the transmission electron beam instrument, and acquiring data from the sample while tilting the liquid cell device about the rotational axis through an angular range of at least 120 degrees.

2. The method of claim 1,
wherein the projected viewable area through a portion of the liquid accessible volume is at least around 10 square micrometers when the liquid cell is rotated about the rotational axis by up to 70 degrees away from the common surface normal of the first and second electron transparent membranes, further comprising acquiring data from the sample while tilting the liquid cell device about its rotational axis through an angular range of at least 140 degrees.

3. The method of claim 1, wherein the projected viewable area through a portion of the liquid accessible volume is at least around 100 square micrometers when the liquid cell is rotated about the rotational axis by up to 70 degrees away from the common surface normal.

4. The method of claim 1, wherein the data comprises EDS data or data acquired from electrons transmitted through the sample, including diffraction, imaging or EELS data.

5. The method of claim 1, wherein tomographic reconstruction is applied to the data to reveal the three-dimensional internal structure of at least a portion of the sample.

6. The method of claim 1, further comprising selecting a liquid cell device having a gap between the first and second electron transparent membranes that ensures that a substantial fraction of the sample remains sufficiently immobile during the data acquisition to allow reliable tomographic reconstruction.

7. The method of claim 1, wherein the sample comprises a multiplicity of crystals and the method further comprising selecting a liquid cell device having a gap between first and second electron transparent membranes that ensures that the multiplicity of crystals have at least a substantially random orientation distribution.

8. The method of claim 1, wherein the liquid cell device comprising:

a main body comprising at least substantially planar and parallel opposing first and second main body surfaces and an aperture affording a line of sight between the first and second main body surfaces and establishing a viewable area parallel projected along the line of sight through the aperture;

a liquid accessible volume enclosed by the main body and at least partially contained within the aperture, the liquid accessible volume containing an intersection of the line of sight with a substantially perpendicular rotational axis of the liquid cell device;

at least substantially planar and parallel first and second electron transparent membranes disposed substantially equidistant from the rotational axis and at least substantially overlapping when viewed along their common surface normal, such that they are separated from each other by a gap measured along their common surface normal, the common surface normal of the first and second electron transparent membranes being substantially parallel to that of the first and second main body surfaces, each membrane spanning and sealing the aperture to enclose at least a portion of the liquid accessible volume, each membrane having substantially similar shape and size, a width, measured along a direction perpendicular to their intersection with a plane perpendicular to the liquid cell rotation axis and a length, measured along a direction parallel to their intersection with a plane perpendicular to the liquid cell rotation axis, wherein the width is less than the length, forming an at least substantially rectangular window;

wherein
the main body is formed as a single piece;
the liquid accessible volume is accessible through at least two sealable openings at the outside surface of the main body;
the width of the at least substantially rectangular window is between around 10 and around 90 micrometers;
the length of the at least substantially rectangular window is between around 300 and around 2000 micrometers;
the main body opposing first and second surfaces are separated along their common surface normal by between around 100 and around 200 micrometers; and
the window gap is less than around 5000 nanometers.

9. A liquid cell device for acquiring from a sample in a liquid medium high angular range tilting tomographic data in a transmission electron beam instrument, the liquid cell device comprising:

a main body comprising at least substantially planar and parallel opposing first and second main body surfaces and an aperture affording a line of sight between the first and second main body surfaces and establishing a viewable area parallel projected along the line of sight through the aperture;

a liquid accessible volume enclosed by the main body and at least partially contained within the aperture, the liquid accessible volume containing an intersection of the line of sight with a substantially perpendicular rotational axis of the liquid cell device;

at least substantially planar and parallel first and second electron transparent membranes disposed substantially equidistant from the rotational axis and at least substantially overlapping when viewed along their common surface normal, such that they are separated from each other by a gap measured along their common surface normal, the common surface normal of the first and second electron transparent membranes being substantially parallel to that of the first and second main body surfaces, each membrane spanning and sealing the aperture to enclose at least a portion of the liquid accessible volume, each membrane having substantially similar shape and size, a width, measured along a direction perpendicular to their intersection with a plane perpendicular to the liquid cell rotation axis and a length, measured along a direction parallel to their intersection with a plane perpendicular to the liquid cell rotation axis, wherein the width is less than the length, forming an at least substantially rectangular window;

wherein the main body is formed as a single piece;

the liquid accessible volume is accessible through at least two sealable openings at the outside surface of the main body;

the width of the at least substantially rectangular window is between around 10 and around 90 micrometers;

the length of the at least substantially rectangular window is between around 300 and around 2000 micrometers;

the main body opposing first and second surfaces are separated along their common surface normal by between around 100 and around 200 micrometers; and the window gap is less than around 5000 nanometers.

10. The liquid cell device of claim 9, wherein the projected viewable area through a portion of the liquid accessible volume is at least around 100 square micrometers when the liquid cell is rotated about the rotational axis by up to 70 degrees away from the common surface normal.

11. The liquid cell device of claim 9, wherein the rotational axis of the liquid cell device is substantially equidistant from the first and second main body surfaces.

12. The liquid cell device of claim 11, wherein the aperture at the first and second main body surfaces has a symmetric profile comprising equally-sized, equally-angled, inwardly-sloping planar walls.

13. The liquid cell device of claim 9, further comprising a second substantially rectangular window disposed orthogonal to and intersecting the first window.

14. The liquid cell device of claim 9, further comprising a second substantially rectangular window disposed parallel and adjacent to the first elongated window.

15. The liquid cell device of claim 9, further comprising a reference window.

16. The liquid cell device of claim 9, wherein the main body comprising at least substantially planar and parallel opposing first and second main body surfaces is comprised of silicon.

17. A method for acquiring high angle tilting tomographic data in a transmission electron beam instrument from a sample in a liquid medium, the method comprising:

introducing the sample in a liquid medium into a liquid accessible volume of a liquid cell device, the liquid cell device comprising:
  a main body comprising opposing first and second main body surfaces and an aperture affording a line of sight between the first and second main body surfaces and establishing a viewable area parallel projected along the line of sight through the aperture;
  the liquid accessible volume being enclosed by the main body and at least partially contained within the aperture, the liquid accessible volume containing an intersection of the line of sight with a substantially perpendicular rotational axis of the liquid cell device; and
  at least substantially planar and parallel first and second electron transparent membranes disposed substantially equidistant from the rotational axis and at least substantially overlapping when viewed along their common surface normal, such that they are separated from each other by a gap measured along their common surface normal, each membrane spanning and sealing the aperture to enclose at least a portion of the liquid accessible volume;

introducing the liquid cell device into the transmission electron beam instrument;

exposing the sample in the liquid accessible volume to an incident electron beam generated in the transmission electron beam instrument, and acquiring data from the sample while tilting the liquid cell device about the rotational axis through an angular range of at least 120 degrees.

18. The method of claim 17, further comprising acquiring data from the sample while tilting the liquid cell device about its rotational axis through an angular range of at least 140 degrees.

19. The method of claim 17, wherein the data comprises EDS data or data acquired from electrons transmitted through the sample, including diffraction, imaging or EELS data.

20. The method of claim 17, wherein tomographic reconstruction is applied to the data to reveal the three-dimensional internal structure of at least a portion of the sample.

* * * * *